(12) United States Patent
Dean et al.

(10) Patent No.: US 9,128,682 B2
(45) Date of Patent: Sep. 8, 2015

(54) INDEPENDENT REMOVABLE COMPUTER RACK POWER DISTRIBUTION SYSTEM FOR HIGH-DENSITY CLUSTERED COMPUTER SYSTEM

(71) Applicant: Silicon Graphics International Corp., Fremont, CA (US)

(72) Inventors: Steven J. Dean, Chippewa Falls, WI (US); Robert E. Mascia, Chippewa Falls, WI (US); Harvey J. Lunsman, Menomonie, WI (US); Michael Kubisiak, Chippewa Falls, WI (US); David R. Collins, Eau Claire, WI (US); Timothy S. McCann, Eleva, WI (US)

(73) Assignee: Silicon Graphics International Corp., Milpitas, CA (US)

( * ) Notice: Subject to any disclaimer, the term of this patent is extended or adjusted under 35 U.S.C. 154(b) by 223 days.

(21) Appl. No.: 13/949,920

(22) Filed: Jul. 24, 2013

(65) Prior Publication Data
US 2014/0126143 A1    May 8, 2014

Related U.S. Application Data

(60) Provisional application No. 61/724,274, filed on Nov. 8, 2012.

(51) Int. Cl.
*G06F 1/20* (2006.01)
*G06F 1/18* (2006.01)
(Continued)

(52) U.S. Cl.
CPC ........ *G06F 1/20* (2013.01); *G06F 1/181* (2013.01); *H05K 7/20754* (2013.01); *G06F 2200/201* (2013.01)

(58) Field of Classification Search
CPC ..... G06F 1/20; G06F 1/181; G06F 2200/201; G06F 13/40; H05K 7/20; H05K 5/00; H05K 7/14; H05K 7/20754; H05K 7/1492; H01L 23/473

USPC ......... 361/601, 602, 611, 622, 623, 624, 642, 361/679.46, 679.53, 689, 698, 699, 700, 361/715–726; 165/80.2, 80.4, 80.5, 104.19, 165/104.33, 104.34, 185; 174/15.1, 50, 174/50.52, 59, 60, 520; 307/12–14, 53, 65, 307/147, 149; 312/223.1, 223.2, 223.3, 312/236, 265; 62/259.2
See application file for complete search history.

(56) References Cited

U.S. PATENT DOCUMENTS

| 4,884,167 A | 11/1989 | Mine |
|---|---|---|
| 4,884,168 A | 11/1989 | August et al. |

(Continued)

FOREIGN PATENT DOCUMENTS

| TW | M413895 | 10/2011 |
|---|---|---|
| WO | 2012118554 A1 | 9/2012 |

OTHER PUBLICATIONS

Woodacre, M. "Capability system with interconnect for global addressability and hardware collectives," 15th Workshop on High Performance Computing in Meterology, Session 10, Oct. 3, 2012, pp. 5-7(online), (retrieved on Feb. 17, 2014), http://www.ecmwf.int/newsevents/meetings/workshops/2012/high_performance_computing_15th/Presentations/.

(Continued)

*Primary Examiner* — Michail V Datskovskiy
(74) *Attorney, Agent, or Firm* — Sunstein Kann Murphy & Timbers LLP

(57) ABSTRACT

A high performance computing system includes one or more blade enclosures configured to hold a plurality of computing blades, a connection interface, coupled to the one or more blade enclosures, having one or more connectors and a shared power bus that distributes power to the one or more blade enclosures, and at least one power shelf removably coupled to the one or more connectors and configured to hold one or more power supplies. The system may further include the computing blades and the power supplies. The power shelf may include a power distribution board configured to connect the power supplies together on the shared power bus.

20 Claims, 27 Drawing Sheets

(51) Int. Cl.
  *H01B 7/30* (2006.01)
  *H05K 7/20* (2006.01)

(56) References Cited

U.S. PATENT DOCUMENTS

| | | | |
|---|---|---|---|
| 5,030,108 A * | 7/1991 | Babow et al. | 439/64 |
| 5,810,501 A | 9/1998 | Ross | |
| 6,064,575 A | 5/2000 | Urda et al. | |
| 6,175,490 B1 * | 1/2001 | Papa et al. | 361/679.48 |
| 6,255,588 B1 * | 7/2001 | Shepherd | 174/72 B |
| 6,828,675 B2 * | 12/2004 | Memory et al. | 257/714 |
| 7,142,411 B2 * | 11/2006 | McLeod | 361/624 |
| 7,173,821 B2 * | 2/2007 | Coglitore | 361/695 |
| 7,318,322 B2 | 1/2008 | Ota et al. | |
| 7,342,789 B2 * | 3/2008 | Hall et al. | 361/701 |
| 7,394,667 B2 * | 7/2008 | Kelly et al. | 361/823 |
| 7,564,685 B2 | 7/2009 | Clidaras et al. | |
| 7,589,974 B2 | 9/2009 | Grady et al. | |
| 7,639,499 B1 * | 12/2009 | Campbell et al. | 361/699 |
| 8,027,162 B2 | 9/2011 | Campbell et al. | |
| 8,351,192 B2 * | 1/2013 | Archibald et al. | 361/679.02 |
| 2002/0124114 A1 | 9/2002 | Bottom et al. | |
| 2005/0071689 A1 * | 3/2005 | Coward et al. | 713/300 |
| 2010/0254089 A1 | 10/2010 | Anderl et al. | |
| 2011/0013348 A1 | 1/2011 | Seibold et al. | |
| 2011/0255230 A1 | 10/2011 | Mori | |
| 2012/0147553 A1 | 6/2012 | Eriksen | |
| 2012/0293947 A1 | 11/2012 | Chen et al. | |
| 2012/0327591 A1 * | 12/2012 | Jau et al. | 361/679.48 |

OTHER PUBLICATIONS

International Searching Authority—International Search Report—International Application No. PCT/US2013/061424 dated Feb. 21, 2014, together with the Written Opinion of the International Searching Authority, 17 pages.

* cited by examiner

INDEPENDENT REMOVABLE COMPUTER RACK POWER DISTRIBUTION SYSTEM FOR HIGH-DENSITY CLUSTERED COMPUTER SYSTEM

CROSS REFERENCE TO RELATED APPLICATIONS

The present application claims priority to U.S. Provisional Patent Application No. 61/724,274 filed Nov. 8, 2012, the disclosure of which is incorporated by reference herein in its entirety.

The present application is related to U.S. patent application entitled ON-BLADE COLD SINK FOR HIGH-DENSITY CLUSTERED COMPUTER SYSTEM, Ser. No. 13/931,730, filed on Jun. 28, 2013, U.S. patent application entitled TWIN SERVER BLADES FOR HIGH-DENSITY CLUSTERED COMPUTER SYSTEM, Ser. No. 13/931,748, filed on Jun. 28, 2013, and U.S. patent application entitled CLOSED-LOOP COOLING SYSTEM FOR HIGH-DENSITY CLUSTERED, Ser. No. 13/931,754, filed on Jun. 28, 2013, the disclosures of which are incorporated by reference herein in their entirety.

TECHNICAL FIELD

The invention generally relates to a power distribution system in a multi-node computer system and, more particularly, the invention relates to an independent and removable power distribution system for a high-density clustered computer system.

BACKGROUND ART

Modern technical computing challenges drive an insatiable appetite for computing power in the quest to solve the world's most complex scientific, technical, and business-related problems. Despite the trend towards large supercomputing clusters based on industry-standard components, there is currently no one-size-fits-all solution in high-performance computing (HPC) systems. As HPC systems have gotten more powerful, physical constraints and density requirements are driving many aspects of the high-density clustered computer configuration. Different application needs drive requirements for specific computational configurations and interconnect topologies. Different physical environments drive the need for specific deployment solutions in terms of physical footprint, power, and cooling. In addition, as HPC technology is applied to solve new problems, or extended to solve old problems at greater scale, system flexibility has become perhaps as important as overall performance.

Effective supercomputing architectures must simultaneously enable the latest technologies while providing maximum flexibility in terms of interconnect, power, and cooling. Standard power supply configurations, however, are unable to flexibly handle the various scale and density requirements currently demanded in some high-density clusters. For example, blade chassis power supplies are typically tightly integrated and designed to meet the power needs of specific components in the blade chassis. Available chassis power, however, ultimately limits the components and processor technology that can be deployed. For instance, as new generations of processors become available, blades with higher-power processors might not be supportable, forcing chassis or rack-level upgrades. While common, this approach can present several disadvantages and limitations, particularly when systems are deployed redundantly in large HPC deployments.

In addition, power supplies are typically configured in redundant fashion in HPC systems. While necessary to supply high availability, redundancy on an enclosure level can quickly result in substantial numbers of extra power supplies being deployed. However, extraneous power supplies continue to draw some power, even when they are not in active use powering components, wasting energy and generating excess heat. Thus, there is a need for a system that enables the flexibility of configurations and the scalability of power solutions.

SUMMARY OF VARIOUS EMBODIMENTS

Various embodiments of the present invention provide a high performance computing ("HPC") system with an independent and scalable power distribution system that is shared across multiple blade enclosures and that allows all connected power supplies to energize a shared power bus. This configuration enables a scalable, modular power architecture that separates the power system from the blade enclosure. In one embodiment of the present invention, the HPC system includes one or more blade enclosures configured to hold a plurality of computing blades, a connection interface, coupled to the one or more blade enclosures, having one or more connectors and a shared power bus that distributes power to the one or more blade enclosures, and one or more power shelves removably coupled to the one or more connectors and configured to hold one or more power supplies. The HPC system may further include the computing blades and the power supplies. The power shelf may include a power distribution board having a control connection, a DC power connection and an AC power connection, and the control and power connections may be configured to removably couple to the one or more connectors. The power distribution board may be configured to connect the power supplies together on the shared power bus that distributes power to the blade enclosures.

In related embodiments, the power shelf may be removably coupled to the one or more connectors in a vertical orientation at a side of the blade enclosure or disposed between a top and bottom of two blade enclosures in a horizontal orientation. The system may include at least two power shelves with one power shelf adjacent to the other power shelf at the side of one blade enclosure. The power shelf may be disposed between two blade enclosures. The system may include at least two power shelves and two blade enclosures, with the two blade enclosures coupled to each other on one side and one power shelf adjacent to each blade enclosure on the other side. The power shelf may be configured to hold three power supplies or four power supplies.

In other related embodiments, the computing blade may include two computing boards and the blade enclosure may include a fluid cooling manifold. The HPC system may further include one or more cooling plates, with each cooling plate disposed between the two computing boards, and a fluid connection coupled to the cooling plate and in fluid communication with the fluid cooling manifold. The cooling manifold may be along a back of the blade enclosure or along a side of the blade enclosure and configured to connect to each cooling plate between the two computing boards. Two cooling plates may be disposed between the two computing boards in a side-by-side configuration, with one cooling plate between the two computing boards in one region of the computing blade and the other cooling plate between the two computing boards in another region of the computing blade. Alternatively, four cooling plates may be disposed between the two computing boards, with two cooling plates between the two computing boards in one region of the computing blade and the other two cooling plates between the two computing boards in another region of the computing blade.

In other related embodiments, the system may further include an external cooling distribution unit having fluid connections in fluid communication with the cooling manifold. The external cooling distribution unit may further include a liquid-cooled heat exchanger in contact with a portion of the fluid connections and one or more pumps configured to move liquid within the fluid connections from the cooling manifolds to the liquid-cooled heat exchanger. The blade enclosures may be configured in two compute racks, and the system may further includes a cooling tower adjacent to a side of the first compute rack and a side of the second compute rack. The cooling tower may have at least one water-cooled heat exchanger, and one or more blowers configured to draw warm air from the side towards a back of the first and second compute racks across the water-cooled heat exchanger, and to circulate cooled air to the side towards a front of the first and second compute racks. The compute racks and cooling tower may be enclosed within a housing to provide a closed-loop air flow within the housing.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a high performance computing ("HPC") system with an independent and scalable power distribution system that is shared across multiple blade enclosures is provided. The independently scalable power distribution system includes a connection interface that allows all connected power supplies to energize a shared power bus. The HPC system includes one or more blade enclosures configured to hold a plurality of computing blades, a connection interface having one or more connectors and a shared power bus that distributes power to the one or more blade enclosures, and at least one power shelf removably coupled to the connectors and configured to hold one or more power supplies. This configuration enables a scalable, modular power architecture that separates the power system from the blade enclosure so that when new power supplies are introduced into the system the blade enclosure will not have to be redesigned. The HPC system may further include the computing blades and the power supplies. The power shelf may include a power distribution board configured to connect the power supplies together on the shared power bus that distributes power to the blade enclosures.

The HPC system may further include an on-blade cooling system that includes one or more cooling plates to provide a greater cooling capacity (e.g., for processors that exceed 600 watts) than rack-level cooling which utilizes fans and air-cooled heat sinks. Additional cooling may be provided to the blades in the system with a cooling distribution unit that is external to the blade enclosure that holds the blades. In addition, the blades may be further air cooled using a closed-loop air flow arrangement with a cooling tower. Details of illustrative embodiments are discussed below.

System Architecture

Figure 1:
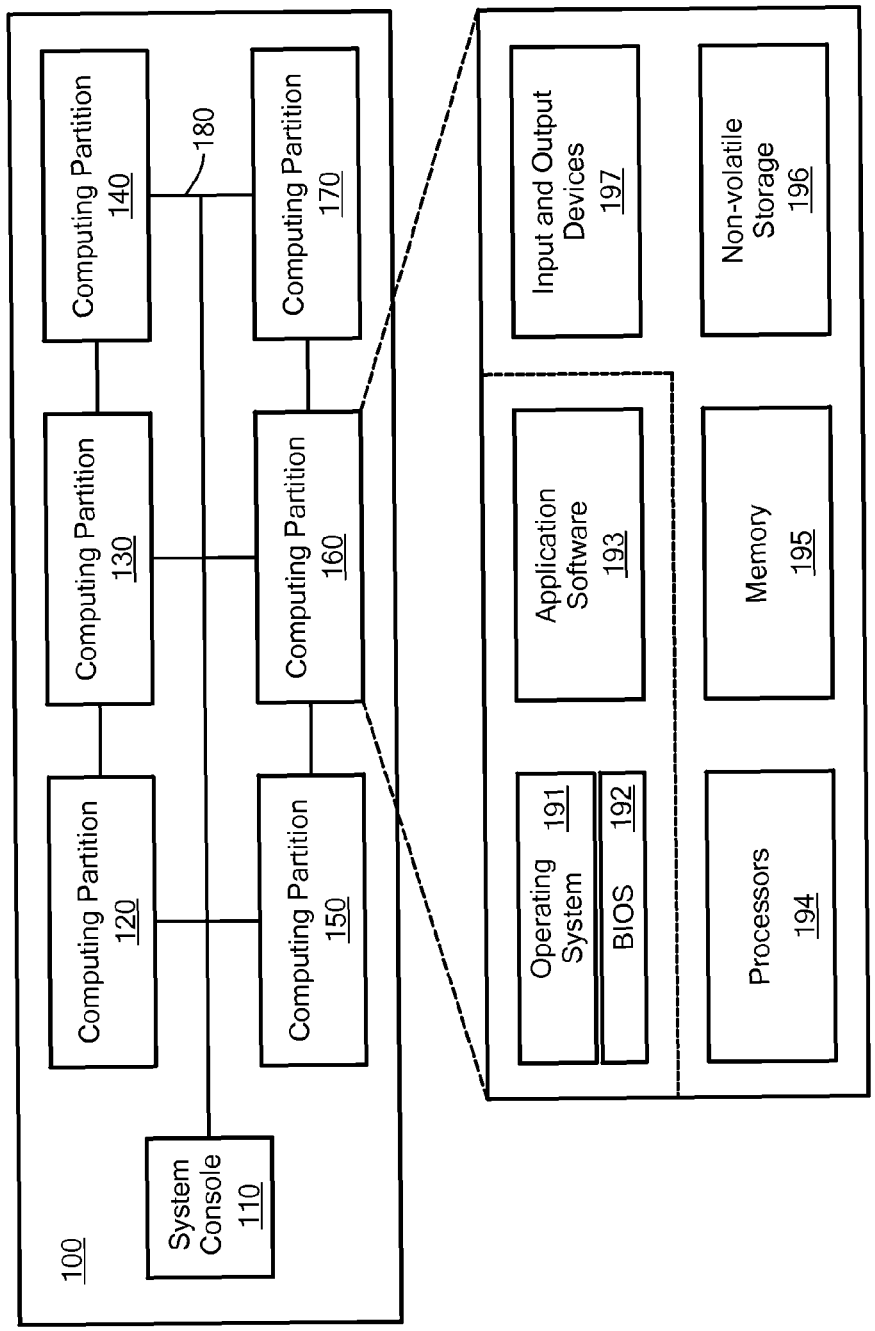
FIG. 1 schematically shows a logical view of an exemplary HPC system used with embodiments of the present invention.

FIG. 1 schematically shows a logical view of an exemplary high-performance computing system 100 that may be used with illustrative embodiments of the present invention. Specifically, as known by those in the art, a "high-performance computing system," or "HPC system," is a computing system having a plurality of modular computing resources that are tightly coupled using hardware interconnects, so that processors may access remote data directly using a common memory address space.

The HPC system 100 includes a number of logical computing partitions 120, 130, 140, 150, 160, 170 for providing computational resources, and a system console 110 for managing the plurality of partitions 120-170. A "computing partition" (or "partition") in an HPC system is an administrative allocation of computational resources that runs a single operating system instance and has a common memory address space. Partitions 120-170 may communicate with the system console 110 using a logical communication network 180. A system user, such as a scientist, engineer, or technician, who desires to perform a calculation, may request computational resources from a system operator, who uses the system console 110 to allocate and manage those resources. Allocation of computational resources to partitions is described below. The HPC system 100 may have any number of computing partitions that are administratively assigned as described in more detail below, and often has only one partition that encompasses all of the available computing resources. Accordingly, this figure should not be seen as limiting the scope of embodiments of the present invention.

Each computing partition, such as partition 160, may be viewed logically as if it were a single computing device, akin to a desktop computer. Thus, the partition 160 may execute software, including a single operating system ("OS") instance 191 that uses a basic input/output system ("BIOS") 192 as these are used together in the art, and application software 193 for one or more system users.

Accordingly, as also shown in FIG. 1, a computing partition may have various hardware allocated to it by a system operator, including one or more processors 194, volatile memory 195, non-volatile storage 196, and input and output ("I/O") devices 197 (e.g., network cards, video display devices, keyboards, and the like). However, in HPC systems like the embodiment in FIG. 1, each computing partition has a great deal more processing power and memory than a typical desktop computer. The OS software may include, for example, a Windows® operating system by Microsoft Corporation of Redmond, Wash., or a Linux operating system. Moreover, although the BIOS may be provided as firmware by a hardware manufacturer, such as Intel Corporation of Santa Clara, Calif., it is typically customized according to the needs of the HPC system designer to support high-performance computing, as described below in more detail.

As part of its system management role, the system console 110 acts as an interface between the computing capabilities of the computing partitions 120-170 and the system operator or other computing systems. To that end, the system console 110 issues commands to the HPC system hardware and software on behalf of the system operator that permit, among other things: 1) booting the hardware, 2) dividing the system computing resources into computing partitions, 3) initializing the partitions, 4) monitoring the health of each partition and any hardware or software errors generated therein, 5) distributing operating systems and application software to the various partitions, 6) causing the operating systems and software to execute, 7) backing up the state of the partition or software therein, 8) shutting down application software, and 9) shutting down a computing partition or the entire HPC system 100. These particular functions are described in more detail in the section below entitled "System Operation."

Figure 2:
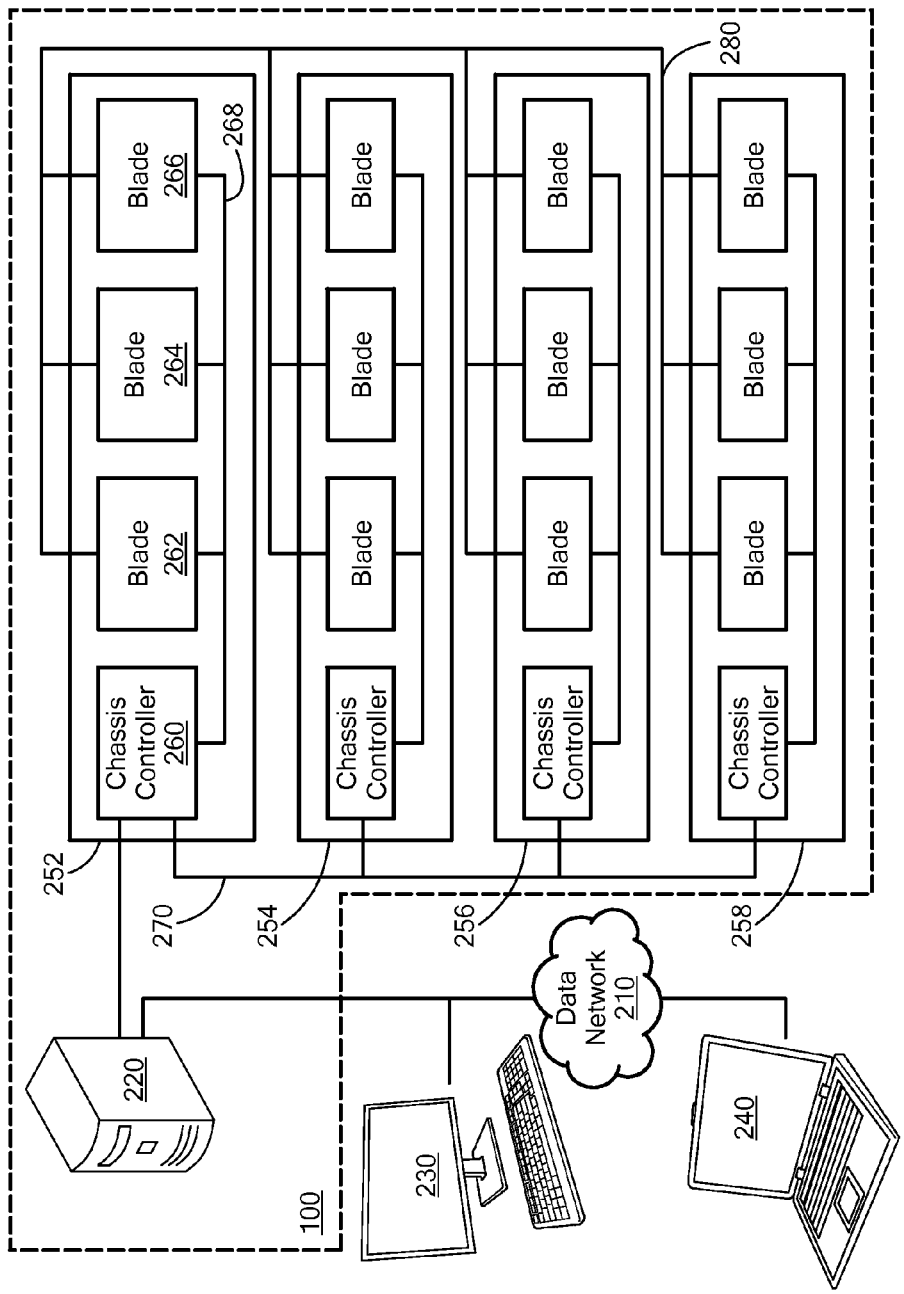
FIG. 2 schematically shows a physical view of the HPC system of FIG. 1.

FIG. 2 schematically shows a physical view of a high performance computing system 100 in accordance with the embodiment of FIG. 1. The hardware that comprises the HPC system 100 of FIG. 1 is surrounded by the dashed line. The HPC system 100 is connected to an enterprise data network 210 to facilitate user access.

The HPC system 100 includes a system management node ("SMN") 220 that performs the functions of the system console 110. The management node 220 may be implemented as a desktop computer, a server computer, or other similar computing device, provided either by the enterprise or the HPC system designer, and includes software necessary to control the HPC system 100 (i.e., the system console software).

The HPC system 100 is accessible using the data network 210, which may include any data network known in the art, such as an enterprise local area network ("LAN"), a virtual private network ("VPN"), the Internet, or the like, or a combination of these networks. Any of these networks may permit a number of users to access the HPC system resources remotely and/or simultaneously. For example, the management node 220 may be accessed by an enterprise computer 230 by way of remote login using tools known in the art such as Windows®Remote Desktop Services or the Unix secure shell. If the enterprise is so inclined, access to the HPC system 100 may be provided to a remote computer 240. The remote computer 240 may access the HPC system by way of a login to the management node 220 as just described, or using a gateway or proxy system as is known to persons in the art.

The hardware computing resources of the HPC system 100 (e.g., the processors, memory, non-volatile storage, and I/O devices shown in FIG. 1) are provided collectively by one or more "blade chassis," such as blade chassis 252, 254, 256, 258 shown in FIG. 2, that are managed and allocated into computing partitions. A blade chassis is an electronic chassis that is configured to house, power, and provide high-speed data communications between a plurality of stackable, modular electronic circuit boards called "blades." Each blade includes enough computing hardware to act as a standalone computing server. The modular design of a blade chassis permits the blades to be connected to power and data lines with a minimum of cabling and vertical space.

Accordingly, each blade chassis, for example blade chassis 252, has a chassis management controller 260 (also referred to as a "chassis controller" or "CMC") for managing system functions in the blade chassis 252, and a number of blades 262, 264, 266 for providing computing resources. Each blade, for example blade 262, contributes its hardware computing resources to the collective total resources of the HPC system 100. The system management node 220 manages the hardware computing resources of the entire HPC system 100 using the chassis controllers, such as chassis controller 260, while each chassis controller in turn manages the resources for just the blades in its blade chassis. The chassis controller 260 is physically and electrically coupled to the blades 262-266 inside the blade chassis 252 by means of a local management bus 268, described below in more detail. The hardware in the other blade chassis 254-258 is similarly configured.

The chassis controllers communicate with each other using a management connection 270. The management connection 270 may be a high-speed LAN, for example, running an Ethernet communication protocol, or other data bus. By contrast, the blades communicate with each other using a computing connection 280. To that end, the computing connection 280 illustratively has a high-bandwidth, low-latency system interconnect, such as NumaLink, developed by Silicon Graphics International Corp. of Fremont, Calif.

The chassis controller 260 provides system hardware management functions to the rest of the HPC system. For example, the chassis controller 260 may receive a system boot command from the SMN 220, and respond by issuing boot commands to each of the blades 262-266 using the local management bus 268. Similarly, the chassis controller 260 may receive hardware error data from one or more of the blades 262-266 and store this information for later analysis in combination with error data stored by the other chassis controllers. In some embodiments, such as that shown in FIG. 2, the SMN 220 or an enterprise computer 230 are provided access to a single, master chassis controller 260 that processes system management commands to control the HPC system 100 and forwards these commands to the other chassis controllers. In other embodiments, however, an SMN 220 is coupled directly to the management connection 270 and issues commands to each chassis controller individually. Persons having ordinary skill in the art may contemplate variations of these designs that permit the same type of functionality, but for clarity only these designs are presented herein.

The blade chassis 252, its blades 262-266, and the local management bus 268 may be provided as known in the art. However, the chassis controller 260 may be implemented using hardware, firmware, or software provided by the HPC system designer. Each blade provides the HPC system 100 with some quantity of processors, volatile memory, non-volatile storage, and I/O devices that are known in the art of standalone computer servers. However, each blade also has hardware, firmware, and/or software to allow these computing resources to be grouped together and treated collectively as computing partitions, as described below in more detail in the section entitled "System Operation."

While FIG. 2 shows an HPC system 100 having four chassis and three blades in each chassis, it should be appreciated that any combination of chassis and blades may be used and these figures do not limit the scope of embodiments of the present invention. For example, an HPC system may have dozens of chassis and hundreds of blades; indeed, HPC systems often are desired because they provide very large quantities of tightly-coupled computing resources.

Figure 3:
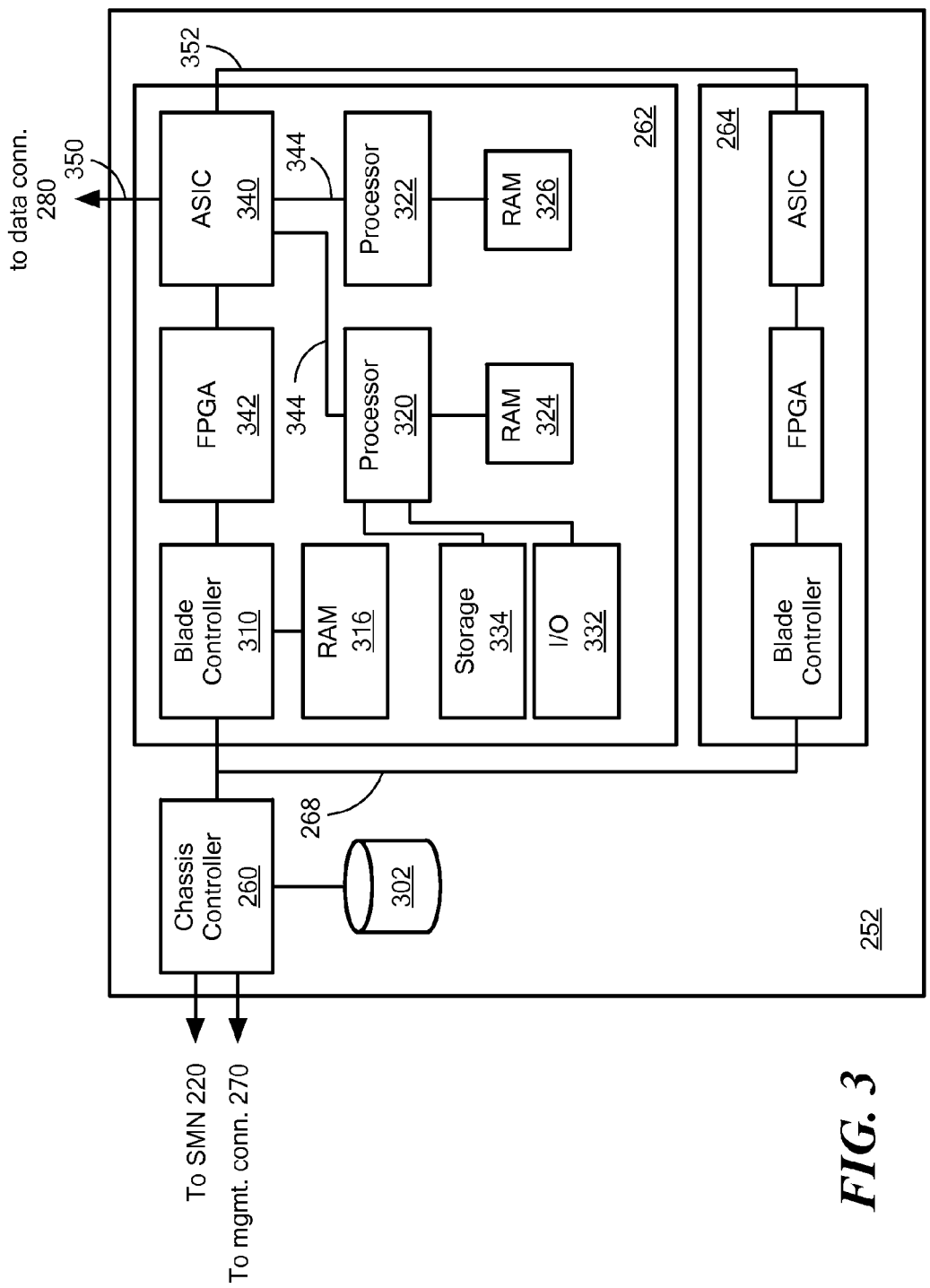
FIG. 3 schematically shows details of an exemplary blade chassis of the HPC system of FIG. 1.

FIG. 3 schematically shows a single blade chassis 252 in more detail. In this figure, parts not relevant to the immediate description have been omitted. The chassis controller 260 is shown with its connections to the system management node 220 and to the management connection 270. The chassis controller 260 may be provided with a chassis data store 302 for storing chassis management data. The chassis data store 302 may be volatile random access memory ("RAM"), in which case data in the chassis data store 302 are accessible by the SMN 220 so long as power is applied to the blade chassis 252, even if one or more of the computing partitions has failed (e.g., due to an OS crash) or a blade has malfunctioned. The chassis data store 302 may be non-volatile storage such as a hard disk drive ("HDD") or a solid state drive ("SSD"). In this case, data in the chassis data store 302 are accessible after the HPC system has been powered down and rebooted.

FIG. 3 shows relevant portions of specific implementations of the blades 262 and 264 for discussion purposes. The blade 262 includes a blade management controller 310 (also called a "blade controller" or "BMC") that executes system management functions at a blade level, in a manner analogous to the functions performed by the chassis controller at the chassis level. For more detail on the operations of the chassis controller and blade controller, see the section entitled "System Operation" below. The blade controller 310 may be implemented as custom hardware, designed by the HPC system designer to permit communication with the chassis controller 260. In addition, the blade controller 310 may have its own RAM 316 to carry out its management functions. The chassis controller 260 communicates with the blade controller of each blade using the local management bus 268, as shown in FIG. 3 and the previous figures.

The blade 262 also includes one or more processors 320, 322 that are connected to RAM 324, 326. Blade 262 may be alternately configured so that multiple processors may access a common set of RAM on a single bus, as is known in the art. It should also be appreciated that processors 320, 322 may include any number of central processing units ("CPUs") or cores, as is known in the art. The processors 320, 322 in the blade 262 are connected to other items, such as a data bus that communicates with I/O devices 332, a data bus that communicates with non-volatile storage 334, and other buses commonly found in standalone computing systems. (For clarity, FIG. 3 shows only the connections from processor 320 to these other devices.) The processors 320, 322 may be, for example, Intel® Core™ processors manufactured by Intel Corporation. The I/O bus may be, for example, a PCI or PCI Express ("PCIe") bus. The storage bus may be, for example, a SATA, SCSI, or Fibre Channel bus. It will be appreciated that other bus standards, processor types, and processor manufacturers may be used with illustrative embodiments of the present invention.

Each blade (e.g., the blades 262 and 264) includes an application-specific integrated circuit 340 (also referred to as an "ASIC", "hub chip", or "hub ASIC") that controls much of its functionality. More specifically, to logically connect the processors 320, 322, RAM 324, 326, and other devices 332, 334 together to form a managed, multi-processor, coherently-shared distributed-memory HPC system, the processors 320, 322 are electrically connected to the hub ASIC 340. The hub ASIC 340 thus provides an interface between the HPC system management functions generated by the SMN 220, chassis controller 260, and blade controller 310, and the computing resources of the blade 262.

In this connection, the hub ASIC 340 connects with the blade controller 310 by way of a field-programmable gate array ("FPGA") 342 or similar programmable device for passing signals between integrated circuits. In particular, signals are generated on output pins of the blade controller 310, in response to commands issued by the chassis controller 260. These signals are translated by the FPGA 342 into commands for certain input pins of the hub ASIC 340, and vice versa. For example, a "power on" signal received by the blade controller 310 from the chassis controller 260 requires, among other things, providing a "power on" voltage to a certain pin on the hub ASIC 340; the FPGA 342 facilitates this task.

The field-programmable nature of the FPGA 342 permits the interface between the blade controller 310 and ASIC 340 to be reprogrammable after manufacturing. Thus, for example, the blade controller 310 and ASIC 340 may be designed to have certain generic functions, and the FPGA 342 may be used advantageously to program the use of those functions in an application-specific way. The communications interface between the blade controller 310 and ASIC 340 also may be updated if a hardware design error is discovered in either module, permitting a quick system repair without requiring new hardware to be fabricated.

Also in connection with its role as the interface between computing resources and system management, the hub ASIC 340 is connected to the processors 320, 322 by way of a high-speed processor interconnect 344. In one embodiment, the processors 320, 322 are manufactured by Intel Corporation which provides the Intel® QuickPath Interconnect ("QPI") for this purpose, and the hub ASIC 340 includes a module for communicating with the processors 320, 322 using QPI. Other embodiments may use other processor interconnect configurations.

The hub chip 340 in each blade also provides connections to other blades for high-bandwidth, low-latency data communications. Thus, the hub chip 340 includes a link 350 to the computing connection 280 that connects different blade chassis. This link 350 may be implemented using networking cables, for example. The hub ASIC 340 also includes connections to other blades in the same blade chassis 252. The hub ASIC 340 of blade 262 connects to the hub ASIC 340 of blade 264 by way of a chassis computing connection 352. The chassis computing connection 352 may be implemented as a data bus on a backplane of the blade chassis 252 rather than using networking cables, advantageously allowing the very high speed data communication between blades that is required for high-performance computing tasks. Data communication on both the inter-chassis computing connection 280 and the intra-chassis computing connection 352 may be implemented using the NumaLink protocol or a similar protocol.

System Operation

System management commands generally propagate from the SMN 220, through the management connection 270 to the blade chassis (and their chassis controllers), then to the blades (and their blade controllers), and finally to the hub ASICS that implement the commands using the system computing hardware.

For example, consider the process of powering on an HPC system. The HPC system 100 is powered when a system operator issues a "power on" command from the SMN 220. The SMN 220 propagates this command to each of the blade chassis 252-258 by way of their respective chassis controllers, such as chassis controller 260 in blade chassis 252. Each chassis controller, in turn, issues a "power on" command to each of the respective blades in its blade chassis by way of their respective blade controllers, such as blade controller 310 of blade 262. Blade controller 310 issues a "power on" command to its corresponding hub chip 340 using the FPGA 342, which provides a signal on one of the pins of the hub chip 340 that allows it to initialize. Other commands propagate similarly.

Once the HPC system is powered on, its computing resources may be divided into computing partitions. The quantity of computing resources that are allocated to each computing partition is an administrative decision. For example, an enterprise may have a number of projects to complete, and each project is projected to require a certain amount of computing resources. Different projects may require different proportions of processing power, memory, and I/O device usage, and different blades may have different quantities of the resources installed. The HPC system administrator takes these considerations into account when partitioning the computing resources of the HPC system 100. Partitioning the computing resources may be accomplished by programming each blade's RAM 316. For example, the SMN 220 may issue appropriate blade programming commands after reading a system configuration file.

The collective hardware computing resources of the HPC system 100 may be divided into computing partitions according to any administrative need. Thus, for example, a single computing partition may include the computing resources of some or all of the blades of one blade chassis 252, all of the blades of multiple blade chassis 252 and 254, some of the blades of one blade chassis 252 and all of the blades of blade chassis 254, all of the computing resources of the entire HPC system 100, or other similar combinations. Hardware computing resources may be partitioned statically, in which case a reboot of the entire HPC system 100 is required to reallocate hardware. Alternatively and preferably, hardware computing resources are partitioned dynamically while the HPC system 100 is powered on. In this way, unallocated resources may be assigned to a partition without interrupting the operation of other partitions.

It should be noted that once the HPC system 100 has been appropriately partitioned, each partition may be considered to act as a standalone computing system. Thus, two or more partitions may be combined to form a logical computing group inside the HPC system 100. Such grouping may be necessary if, for example, a particular computational task is allocated more processors or memory than a single operating system can control. For example, if a single operating system can control only 64 processors, but a particular computational task requires the combined power of 256 processors, then four partitions may be allocated to the task in such a group. This grouping may be accomplished using techniques known in the art, such as installing the same software on each computing partition and providing the partitions with a VPN.

Once at least one partition has been created, the partition may be booted and its computing resources initialized. Each computing partition, such as partition 160, may be viewed logically as having a single OS 191 and a single BIOS 192. As is known in the art, a BIOS is a collection of instructions that electrically probes and initializes the available hardware to a known state so that the OS can boot, and is typically provided in a firmware chip on each physical server. However, a single logical computing partition 160 may span several blades, or even several blade chassis. A blade may be referred to as a "computing node" or simply a "node" to emphasize its allocation to a particular partition; however, it will be understood that a physical blade may comprise more than one computing node if it has multiple processors 320, 322 and memory 324, 326.

Booting a partition may require a number of modifications to be made to a standard blade chassis. In particular, the BIOS in each blade is modified to determine other hardware resources in the same computing partition, not just those in the same blade or blade chassis. After a boot command has been issued by the SMN 220, the hub ASIC 340 eventually provides an appropriate signal to the processor 320 to begin the boot process using BIOS instructions. The BIOS instructions, in turn, obtain partition information from the hub ASIC 340 such as: an identification (node) number in the partition, a node interconnection topology, a list of devices that are present in other nodes in the partition, a master clock signal used by all nodes in the partition, and so on. Armed with this information, the processor 320 may take whatever steps are required to initialize the blade 262, including 1) non-HPC-specific steps such as initializing I/O devices 332 and non-volatile storage 334, and 2) also HPC-specific steps such as synchronizing a local hardware clock to a master clock signal, initializing HPC-specialized hardware in a given node, managing a memory directory that includes information about which other nodes in the partition have accessed its RAM, and preparing a partition-wide physical memory map.

At this point, each physical BIOS has its own view of the partition, and all of the computing resources in each node are prepared for the OS to load. The BIOS then reads the OS image and executes it, in accordance with techniques known in the art of multiprocessor systems. The BIOS presents to the OS a view of the partition hardware as if it were all present in a single, very large computing device, even if the hardware itself is scattered among multiple blade chassis and blades. In this way, a single OS instance spreads itself across some, or preferably all, of the blade chassis and blades that are assigned to its partition. Different operating systems may be installed on the various partitions. If an OS image is not present, for example immediately after a partition is created, the OS image may be installed using processes known in the art before the partition boots.

Once the OS is safely executing, its partition may be operated as a single logical computing device. Software for carrying out desired computations may be installed to the various partitions by the HPC system operator. Users may then log into the SMN 220. Access to their respective partitions from the SMN 220 may be controlled using volume mounting and directory permissions based on login credentials, for example. The system operator may monitor the health of each partition, and take remedial steps when a hardware or software error is detected. The current state of long-running application programs may be saved to non-volatile storage, either periodically or on the command of the system operator or application user, to guard against losing work in the event of a system or application crash. The system operator or a system user may issue a command to shut down application software. Other operations of an HPC partition may be known to a person having ordinary skill in the art. When administratively required, the system operator may shut down a computing partition entirely, reallocate or deallocate computing resources in a partition, or power down the entire HPC system 100.

Power Distribution System Configuration

Figure 4A:
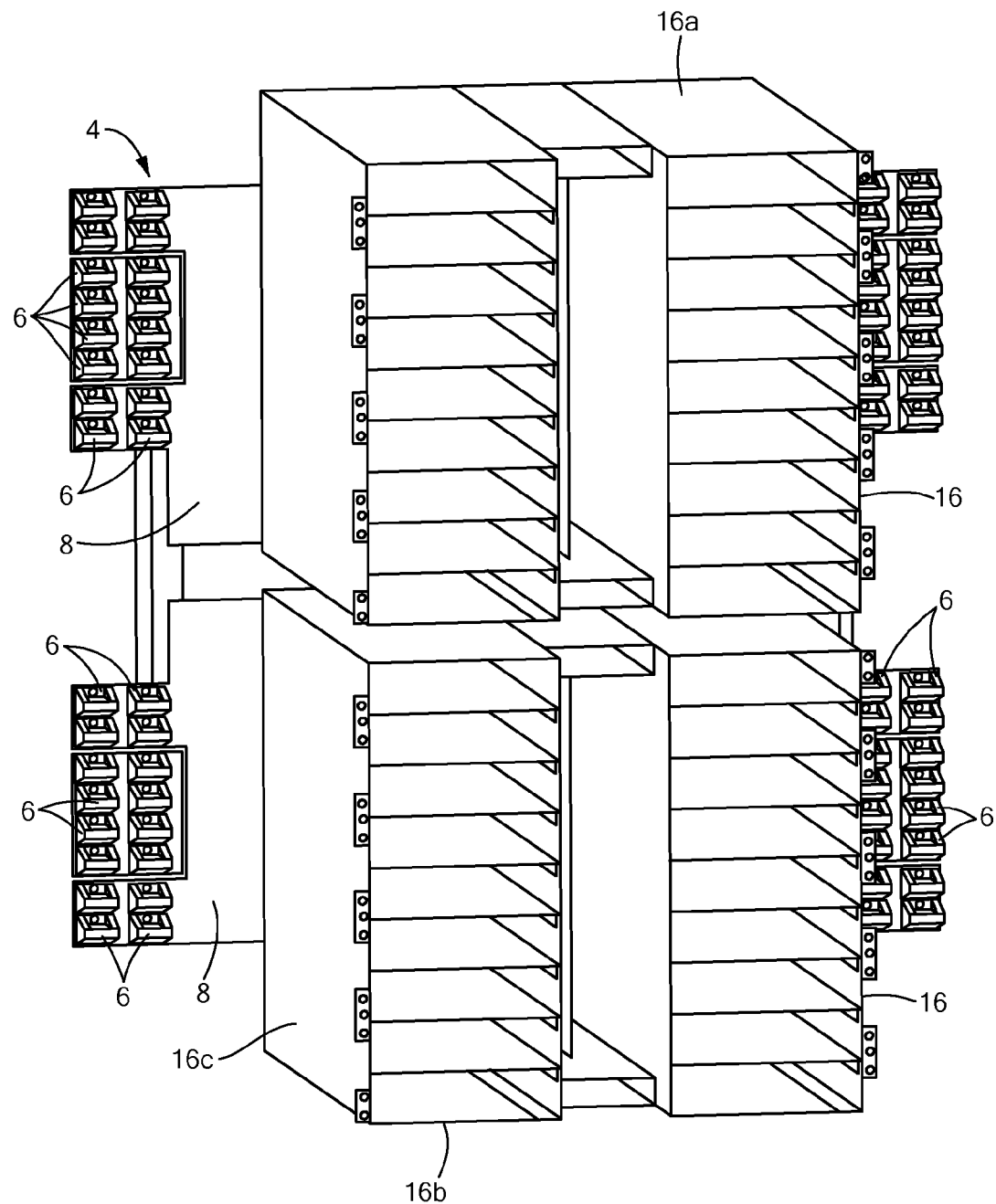
FIGS. 4A and 4B schematically show a perspective front view and back view, respectively, of two blade enclosures with a power distribution system (with power shelves removed) and FIG. 4C schematically shows a front view of FIGS. 4A and 4B with power shelves attached in accordance with an embodiment of the present invention.
Figure 4B:
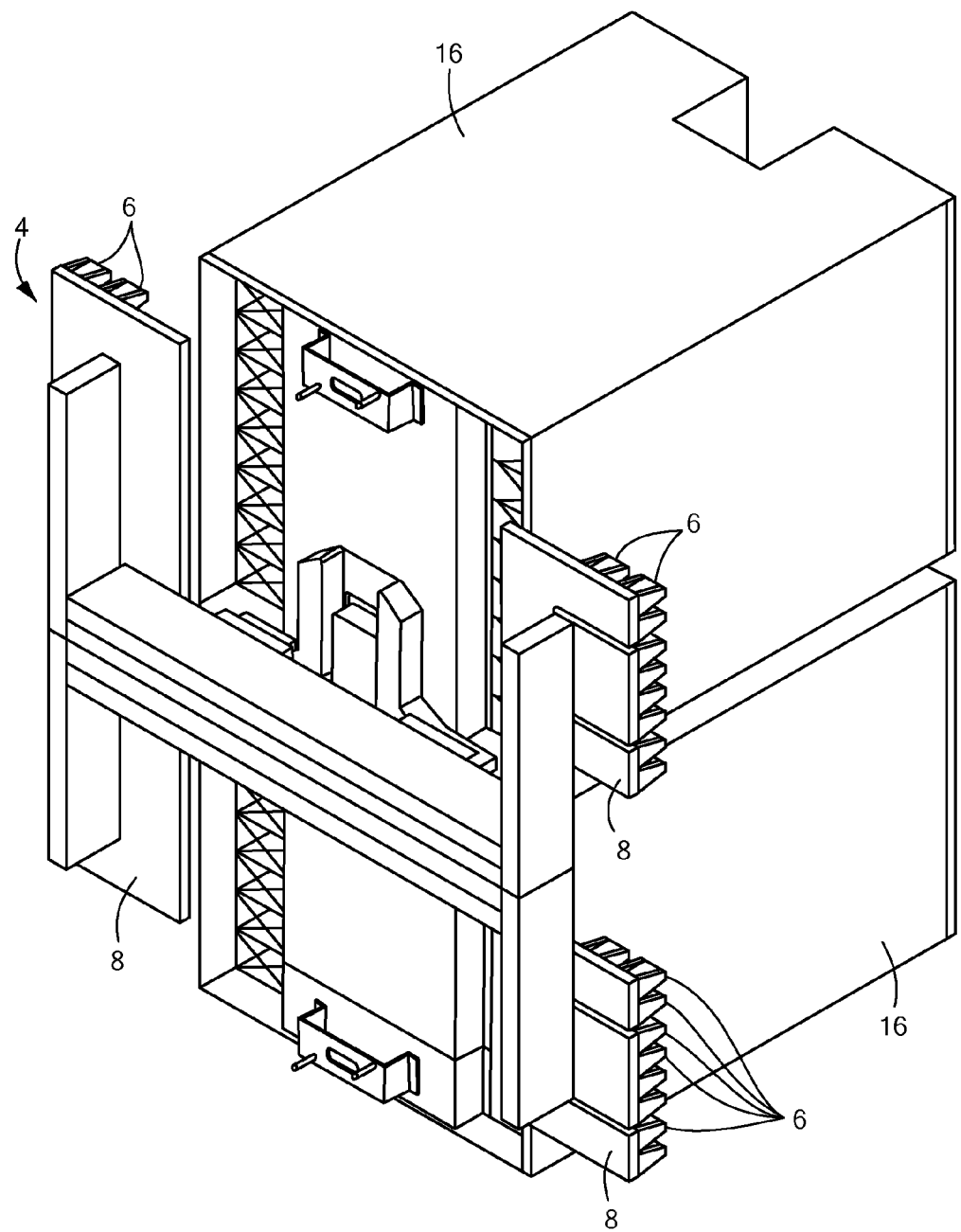
Figure 4C:
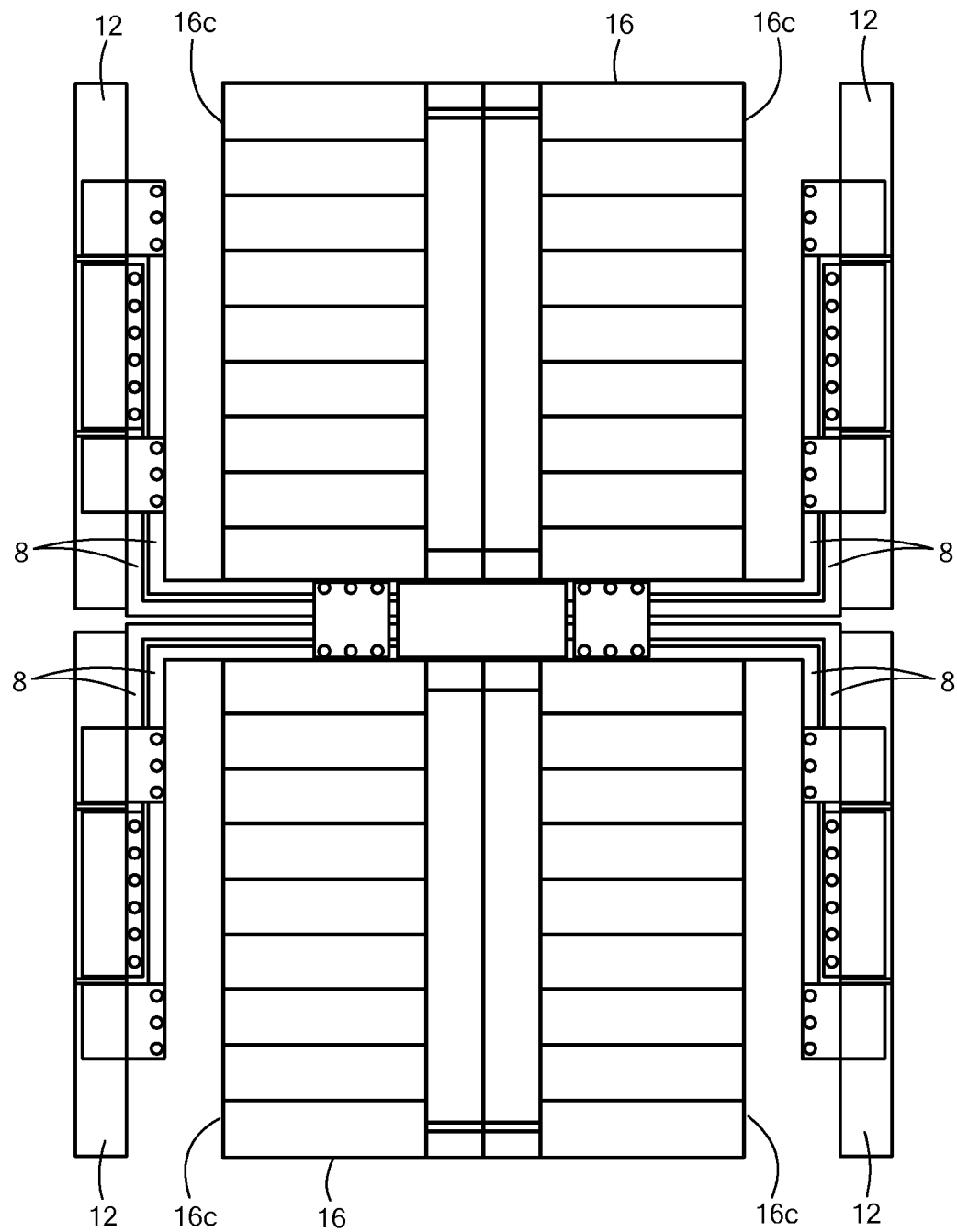
Figure 5A:
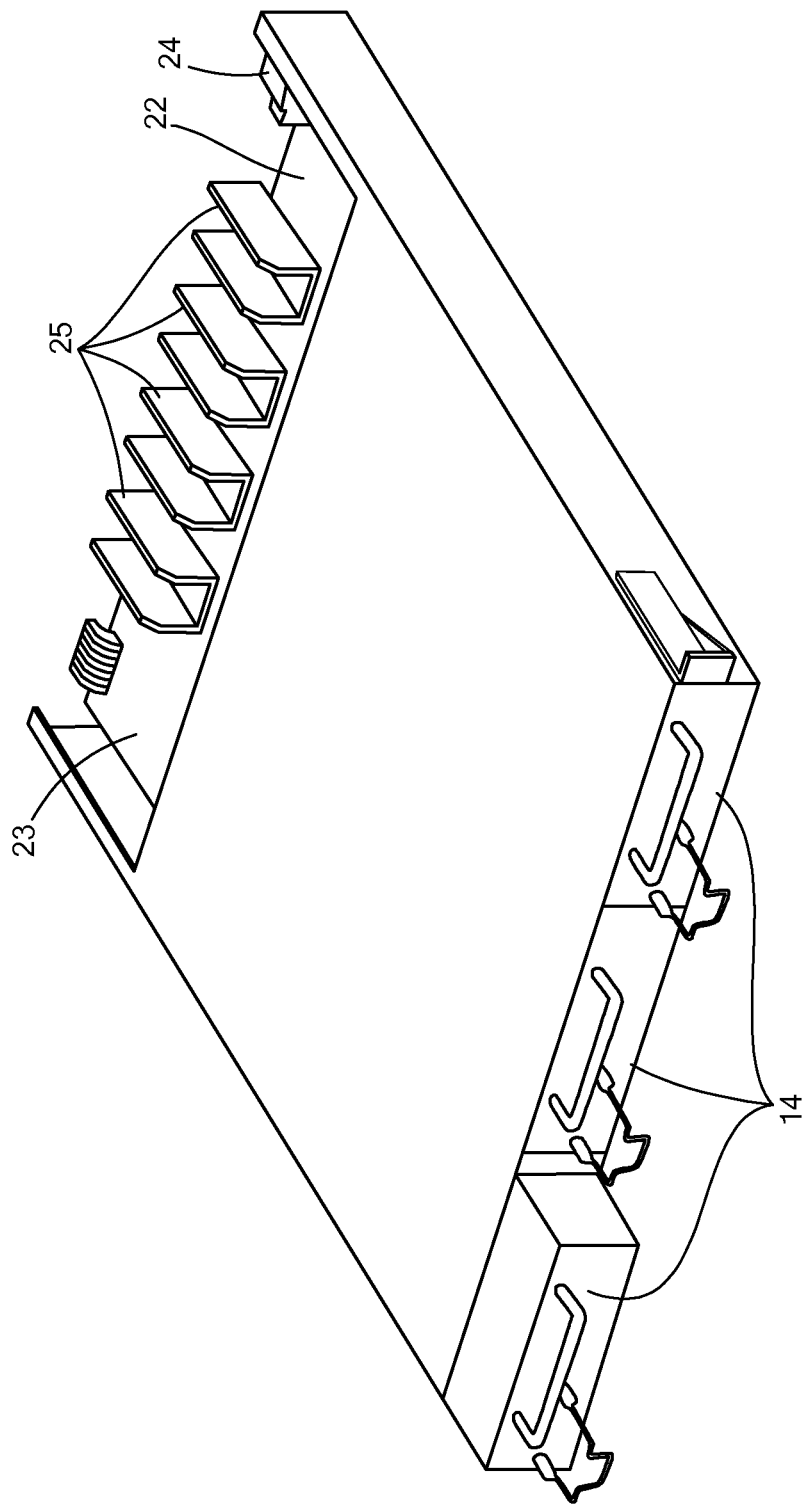
FIG. 5A schematically shows a front perspective view of a power shelf with power supplies and FIGS. 5B and 5C schematically show a back perspective view of the power shelf with the top on and removed, respectively, without power supplies in accordance with an embodiment of the present invention.
Figure 5B:
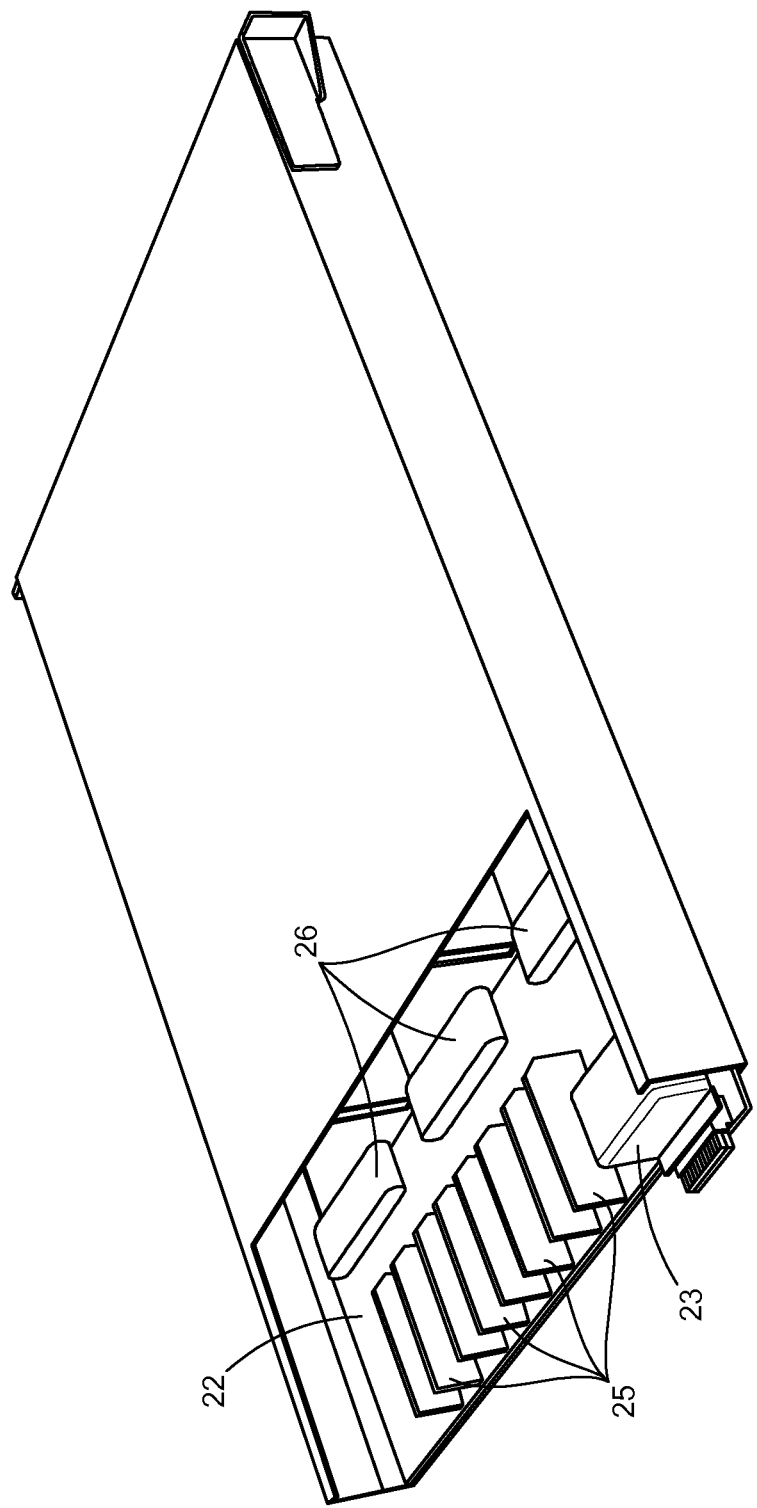
Figure 5C:
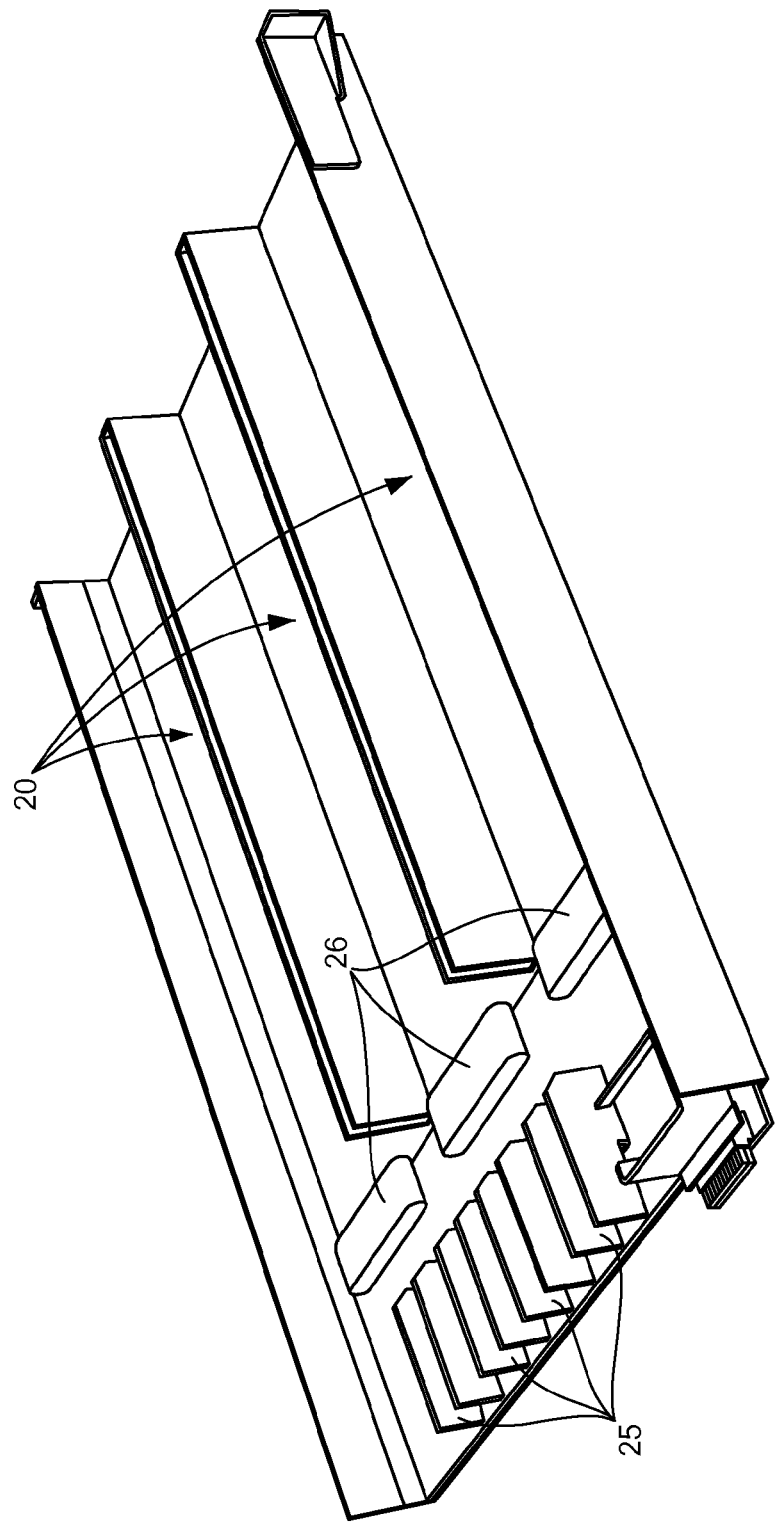
Figure 6A:
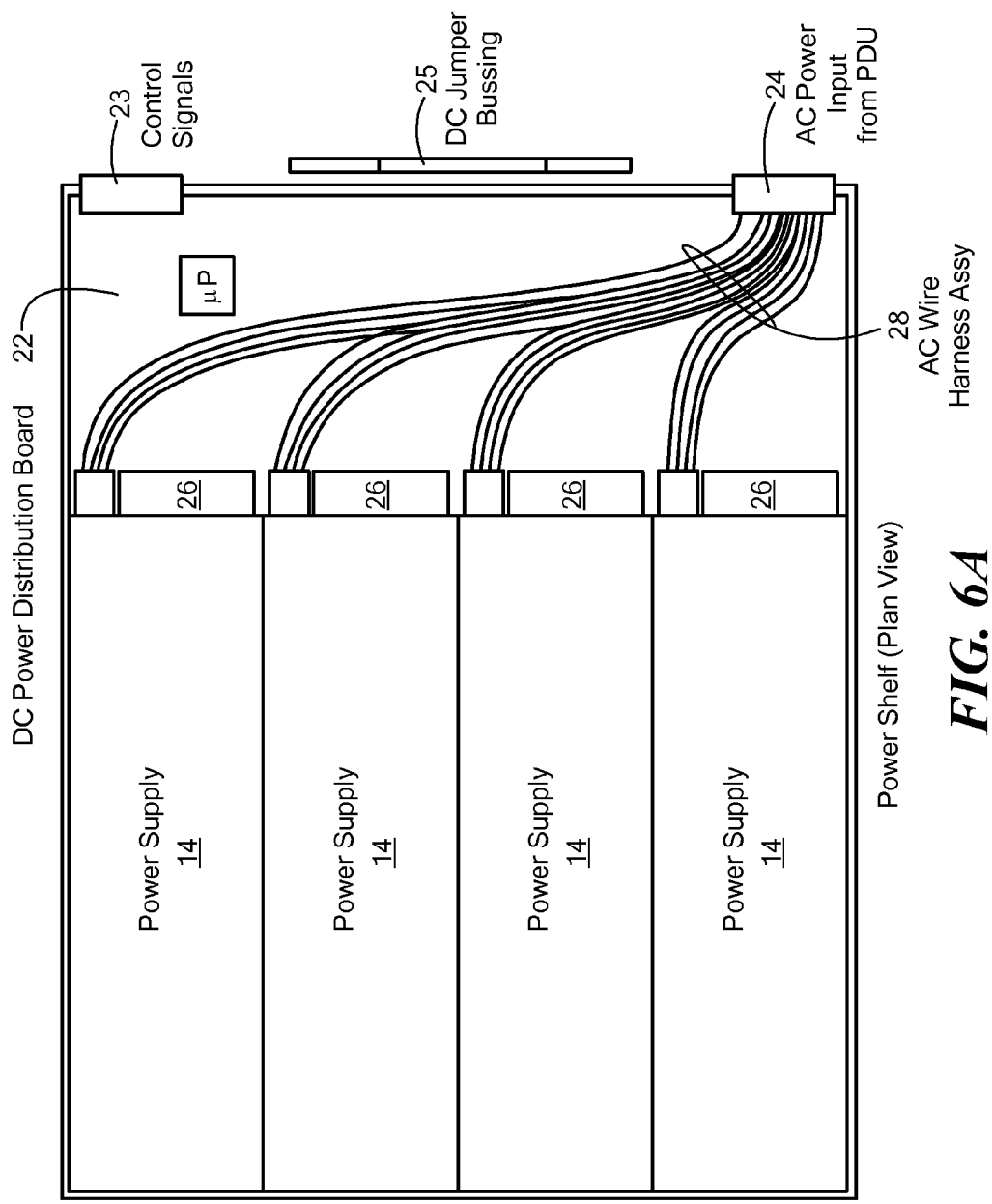
FIGS. 6A through 6C schematically show various views of a power shelf in accordance with an embodiment of the present invention.
Figure 6B:
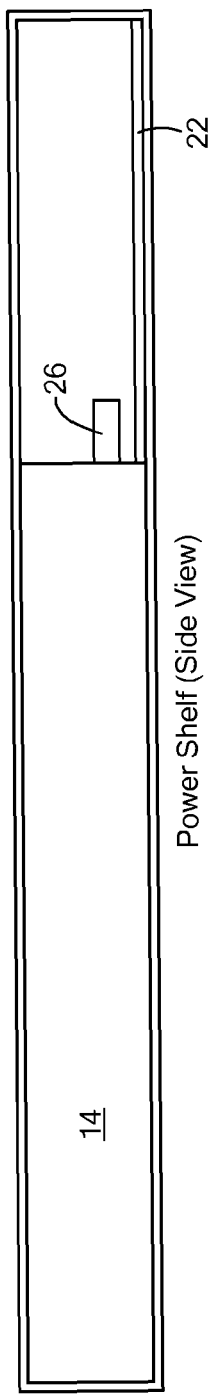
Figure 6C:
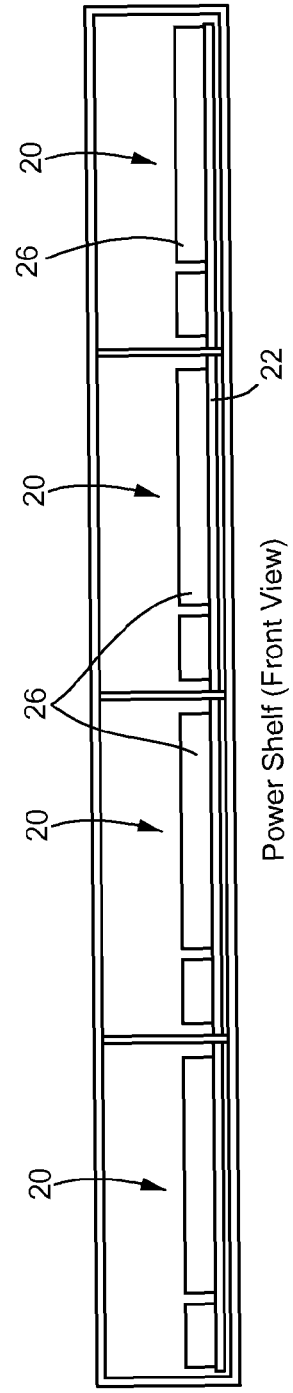
Figure 8A:
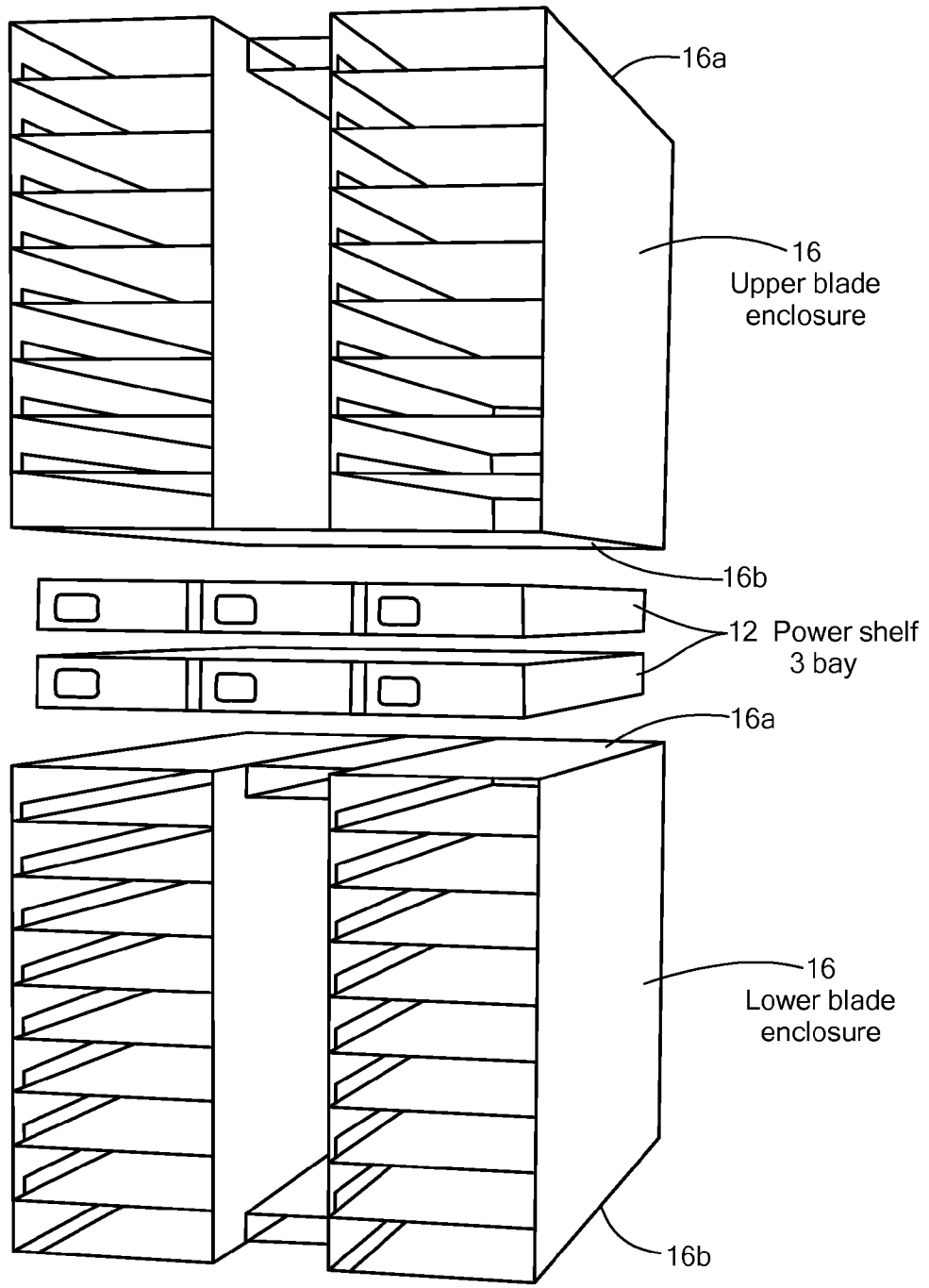
FIG. 8A shows an exploded perspective view of two power shelves between blade enclosures and FIG. 8B shows a connection interface used with the configuration of FIG. 8A in accordance with an embodiment of the present invention.
Figure 8B:
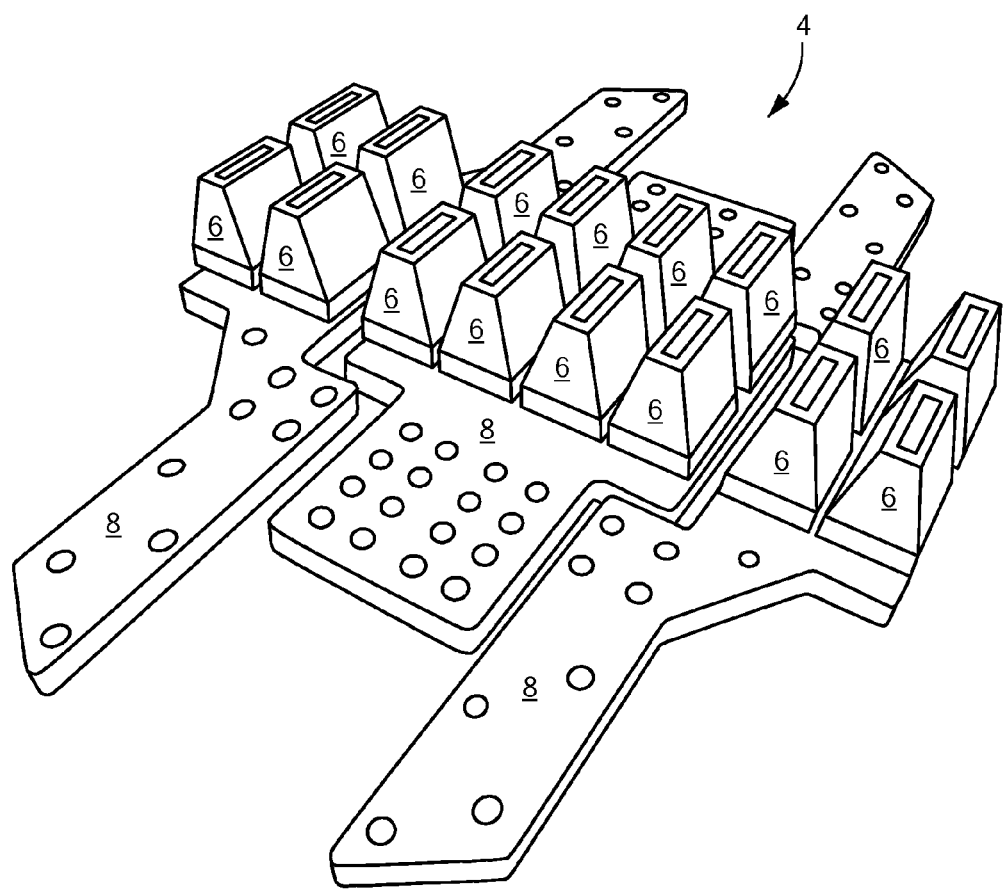
Figure 9:
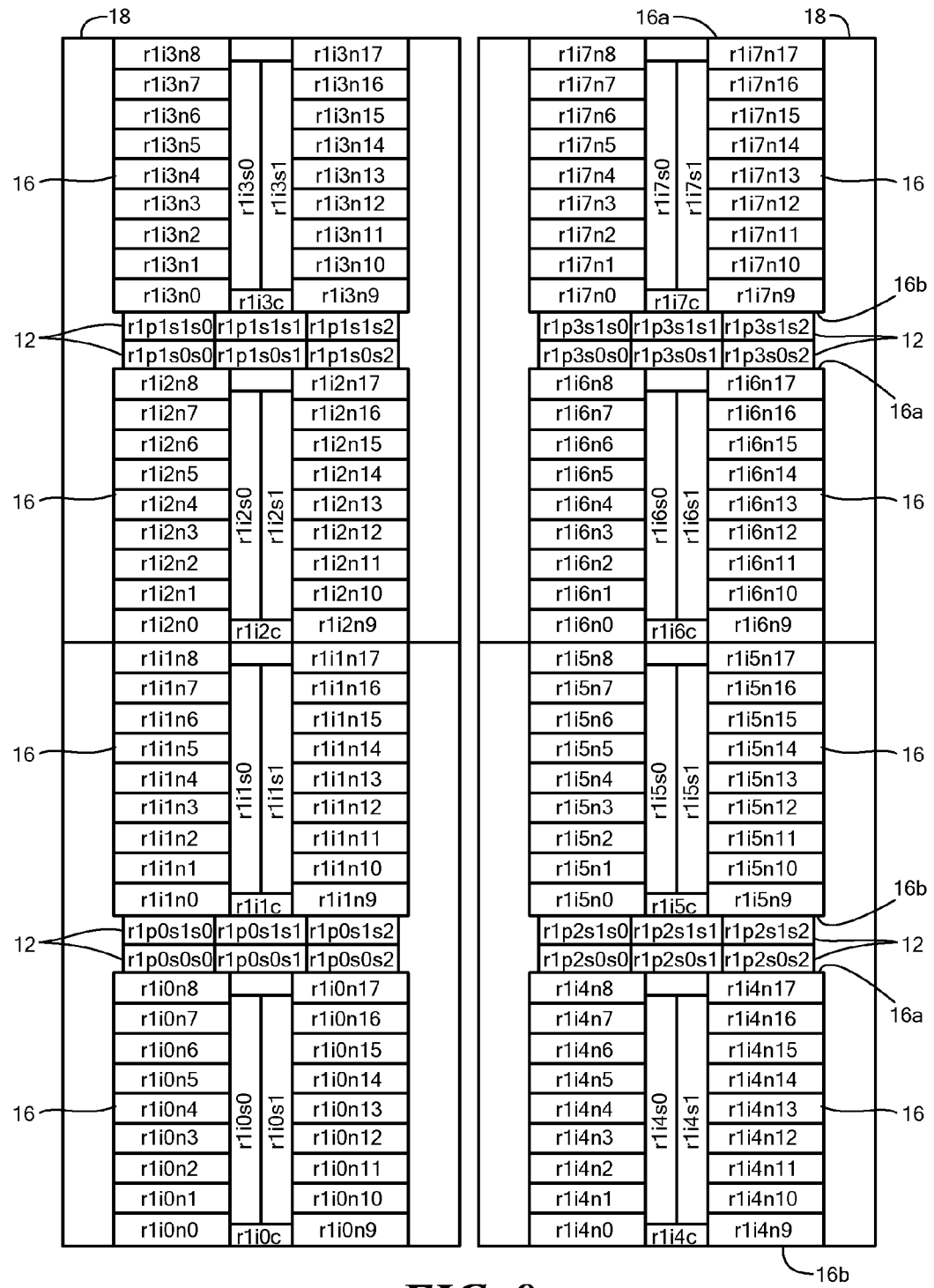
FIG. 9 schematically shows two compute racks with blade enclosures and power shelves between the blade enclosures in accordance with an embodiment of the present invention.
Figure 13A:
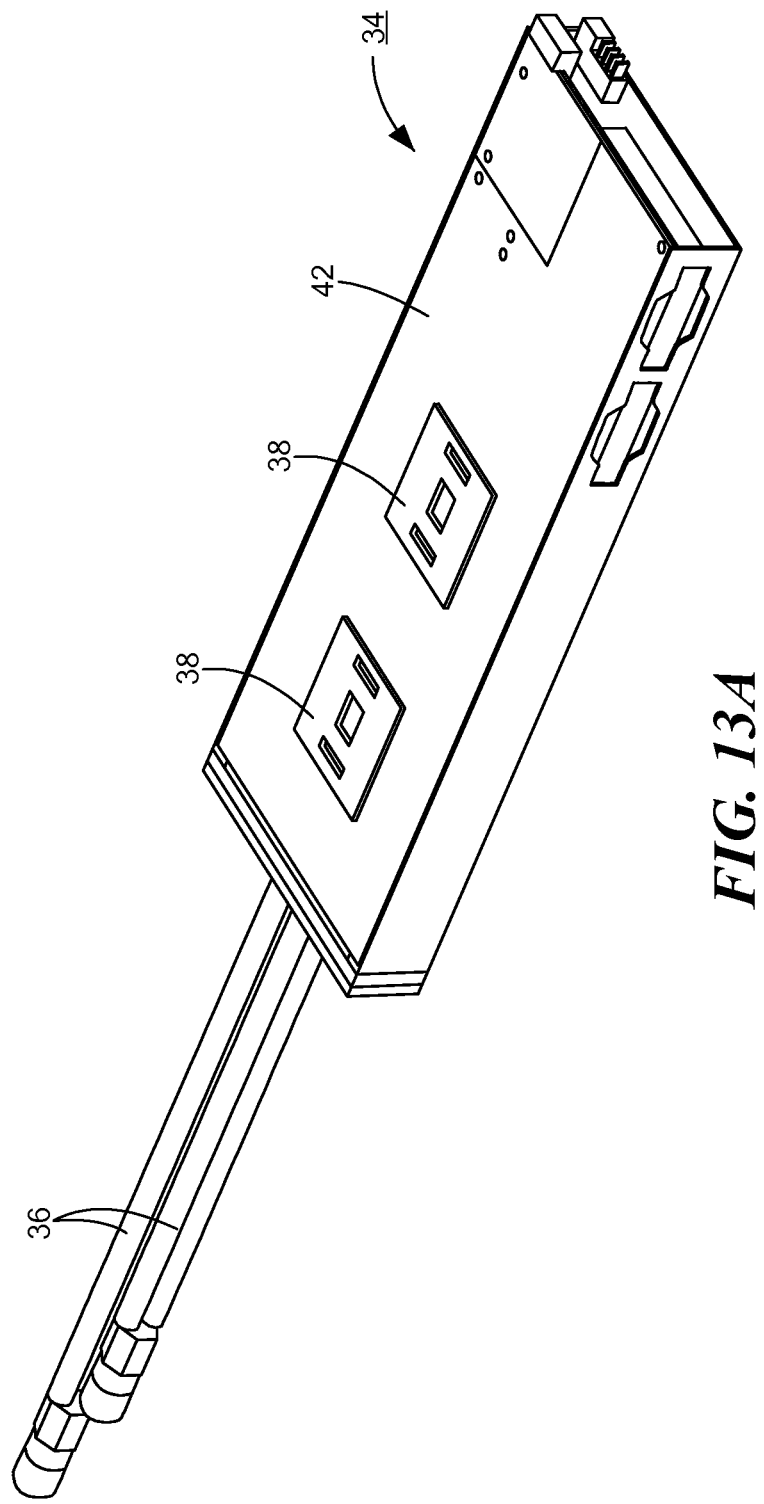
FIGS. 13A and 13B show a top perspective view and an exploded view, respectively, of a blade with an on-blade cold sink used with embodiments of the present invention.
Figure 13B:
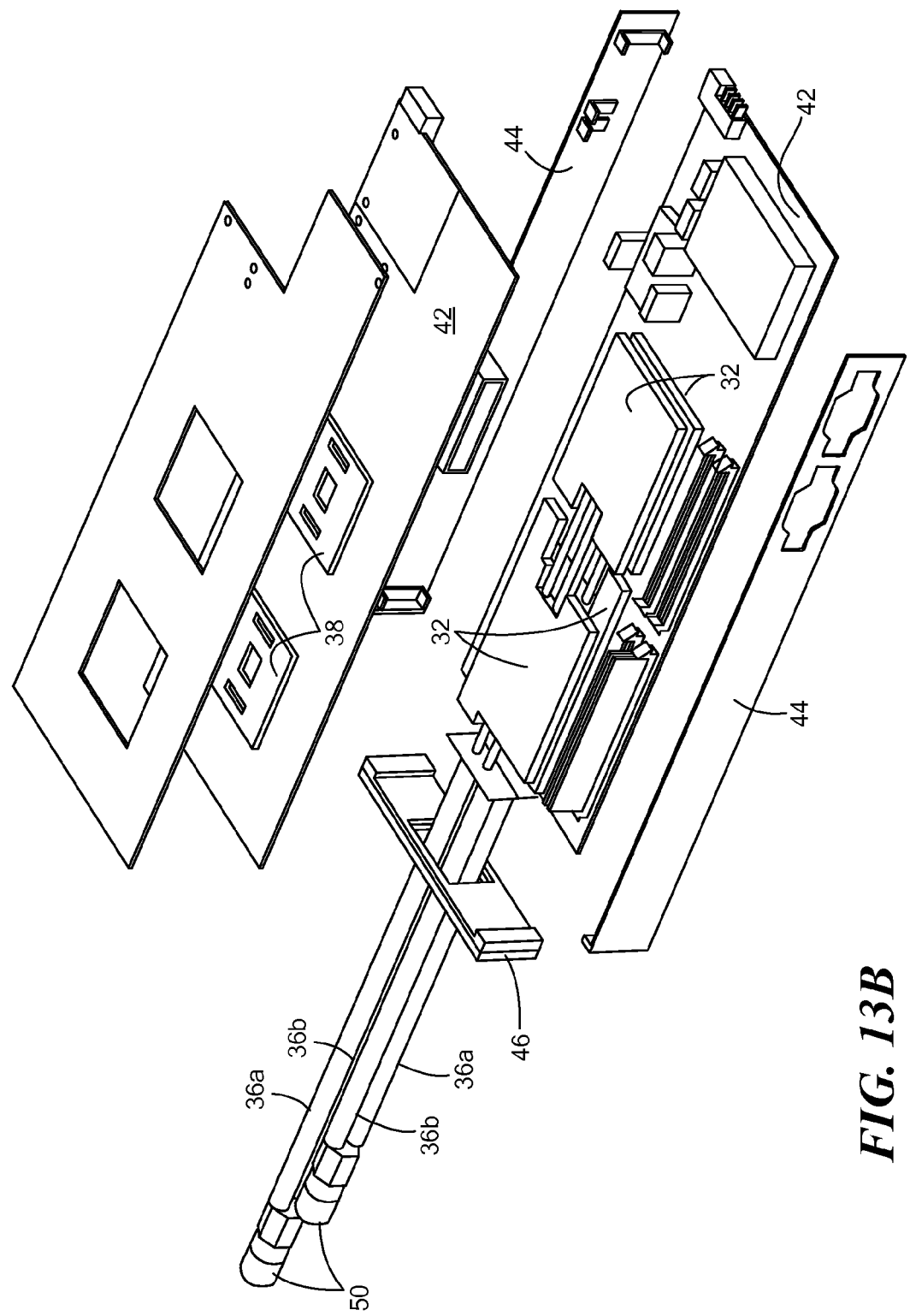

FIGS. 4A through 4C schematically show an HPC system with one embodiment of an independent and scalable power distribution system. The HPC system includes one or more blade enclosures 16 configured to hold a plurality of computing blades 34 (such as shown in FIGS. 13A and 13B) and a power distribution system 10 having a connection interface 4 and one or more power shelves 12 configured to hold one or more power supplies 14 (as shown in FIGS. 5A and 6A). The connection interface 4 includes one or more connectors 6 electrically coupled to a shared power bus 8 that distributes power to the one or more blade enclosures 16. The shared power bus 8 may be in an H-shape with the connectors 6 disposed on its outer, vertical sides, such as shown in FIGS. 4A through 4C. Alternatively, the shared power bus 8 may be in an H-shape with the connectors disposed along its horizontal center or an I-shape with the connectors disposed along its vertical center, such as shown in FIG. 8B, although other shapes may also be used depending on where the power shelves 12 are disposed in relation to the blade enclosures 16. Each power shelf 12 is removably coupled to the one or more connectors 6. The connection interface 4 provides a standard power and control interface that is blind mate capable. This configuration enables a scalable, modular power architecture since the power system is not integrally connected with the blade enclosure 16, but rather is separated from it. As shown in FIGS. 4A and 4C, the one or more power shelves 12 may be removably coupled to the connectors 6 in a vertical orientation disposed at a side 16c of the blade enclosures 16 in a compute rack 18. Alternatively, the power shelves 12 may be removably coupled to the connectors 6 and disposed between a top 16a and a bottom 16b of two blade enclosures 16 in a horizontal orientation in a compute rack 18, as shown in FIGS. 8A and 9 discussed below.

Figure 7:
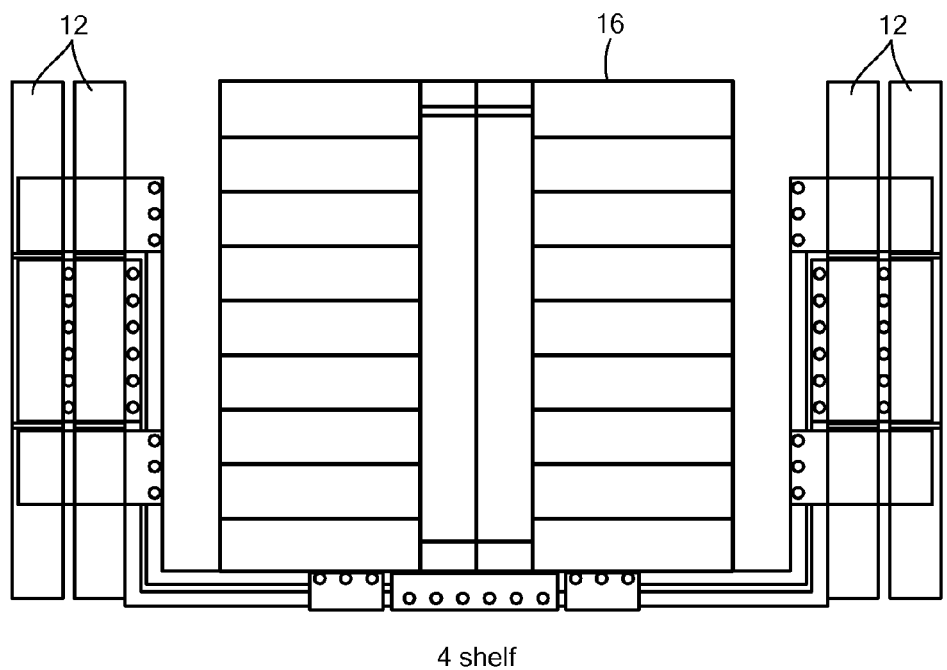
FIG. 7 schematically shows a front view of one blade enclosure with a power distribution system having a double row of power shelves on each side of the blade enclosure in accordance with an embodiment of the present invention.

As shown in more detail in FIGS. 5A through 6C, the power shelf 12 includes one or more power supply bays 20 that are configured to hold the power supplies 14. Preferably, the power shelf 12 holds three or four power supplies 14, e.g., 2837 watt or 3037 watt power supplies, although other configurations may be used depending on the HPC system power requirements. The power shelf 12 also includes a power distribution board 22, preferably located at the rear of the power shelf 12, that is configured to connect the power supplies 14 together on the shared power bus 8. The power distribution board 22 includes various connections that connect the power distribution board 22 to the connection interface 4 via the connectors 6. For example, a control connection 23 provides power shelf control signals from the HPC system to the power shelf 12 (e.g., for turning on DC power, etc.) and status signals from the power shelf 12 to the HPC system (e.g., for notifications of failures or communicating performance or environmental conditions, etc.). Similarly, an AC power connection 24 provides an AC power feed into the power shelf 12, and a DC power connection 25 provides a high current DC power feed out of the power shelf 12 and into the HPC system, e.g., to the blade enclosures 16, and thus the computing blades 34. As shown in FIGS. 4B and 4C, the shared power bus 8 is electrically connected to the blade enclosure 16 and allows any number of power shelves 12 to power one or more blade enclosures 16. For example, four power shelves 12, one on each side of the blade enclosures, may power two blade enclosures, such as shown in FIG. 4C, and four power shelves 12, two disposed adjacent to one another on each side of one blade enclosure, may power one blade enclosure, such as shown in FIG. 7.

Referring again to FIGS. 5A through 6C, the power distribution board 22 also includes power connectors 26 that electrically connect the power supplies 14 to the power distribution board 22. The power shelf 12 also includes electrical connections 28 that provide the AC power to the power supplies 14. This independently-scalable power shelf configuration enables power shelves 12 to be easily added or removed, depending on the power requirements of the HPC system configuration. Since the power shelf 12 is shared across multiple enclosures, and all connected power supplies 14 energize a shared power bus 8 (e.g., 12V power bus), blade enclosures 16 can gain more usable power with fewer power supplies and less waste. For example, a 5+1 power supply configuration can provide more usable power than dual 2+1 configurations, while reducing the number of spare power supplies necessary for redundancy by half. These economies of scale improve with larger configurations.

Thus, the power interface may be scaled as the power requirements of a blade change, which enables considerable flexibility depending on rack configuration and the power requirements of installed components. This flexible scaling of available power allows the system to meet specific per-node power level requirements as well as future technology generations that may require greater power. For example, the system may be designed to scale from 400 W per node to as much as 1,440 W per node, and power shelves can be upgraded independently as new power technologies become available. When less power is required, power shelves can be populated only as required to provide the power needed to energize installed components, yielding considerable power supply capacity and flexibility. Therefore, embodiments of the present invention provide more available power to the blade enclosure and power flexibility for future technology advancements, while reducing redundant power supply deployment and costly power drain.

Figure 10A:
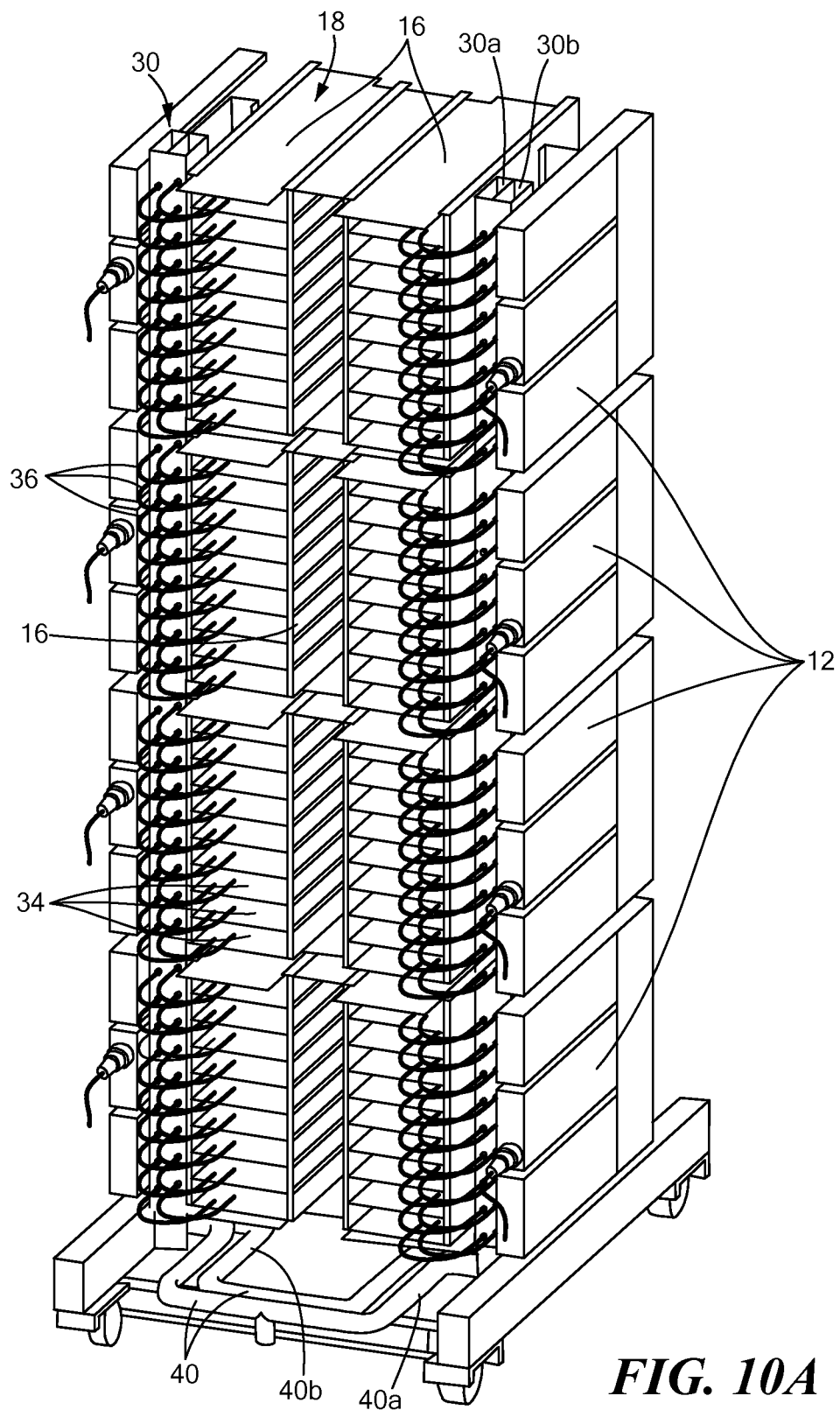
FIGS. 10A and 10B schematically show a front perspective view and a front view, respectively, of a compute rack configuration with a power distribution system having power shelves on a side of blade enclosures in accordance with an embodiment of the present invention.
Figure 10B:
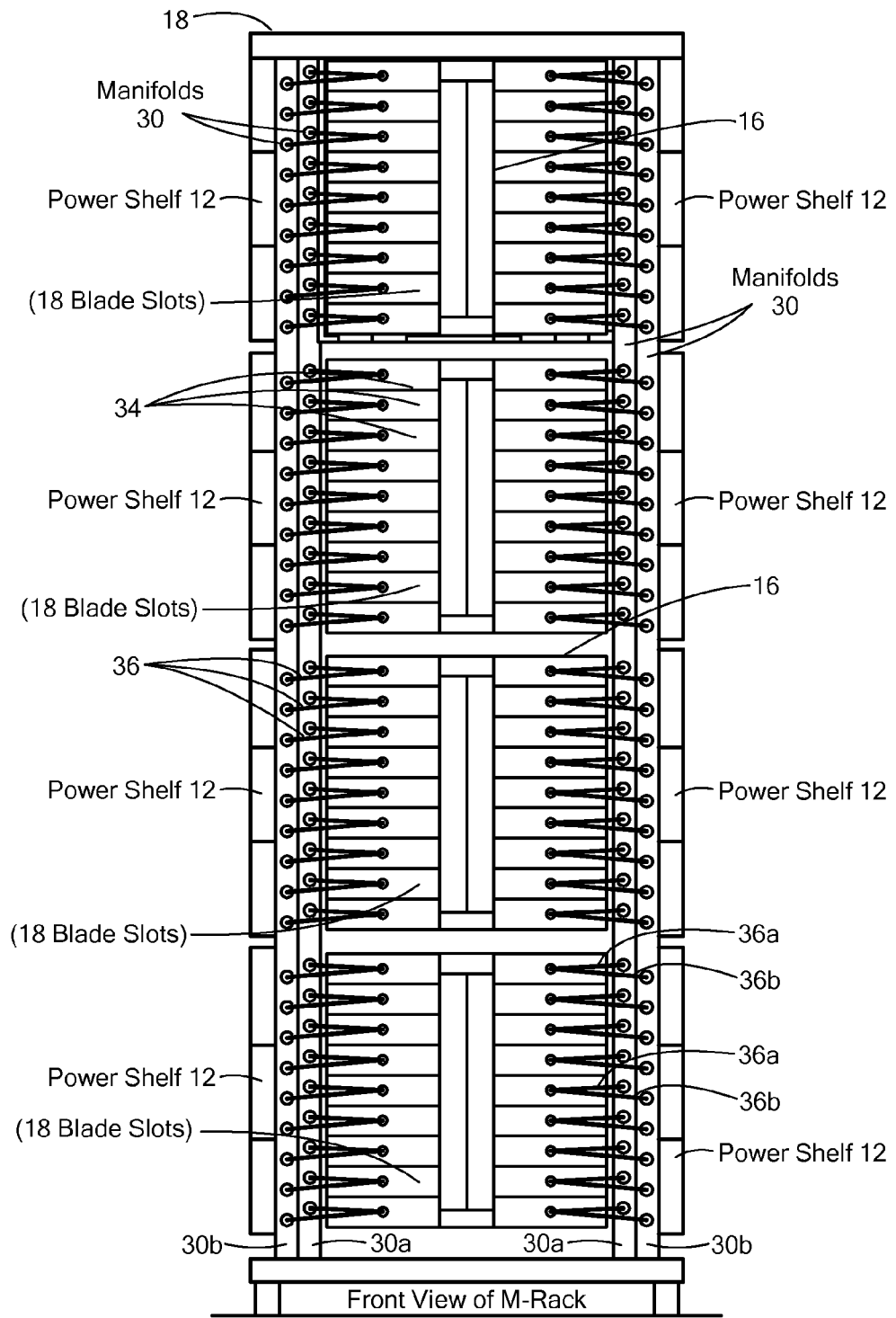

As previously mentioned, the power shelf 12, connection interface 4, and blade enclosure 16 configuration may vary depending upon the power and physical footprint requirements. For example, the blade enclosures 16 may be stacked one on top of the other with the power shelves 12 disposed on the sides 16c of the blade enclosure 16 in a vertical orientation, such as shown in FIGS. 4C, 10A and 10B. Depending on the power requirements, each blade enclosure 16 may include one or more power shelves 12 disposed adjacent to one or both sides of the blade enclosure 16. The power shelves 12 may be stacked adjacent to one another on each side of the blade enclosure 16, e.g., in a single row, double row, triple row, etc. In this way, any combination of power shelves 12 may be used in the compute rack to support a particular blade configuration. For example, in the configuration shown in FIGS. 10A and 10B, the upper two enclosure pairs share a power bus 8 (such as shown in FIG. 4) and the lower two enclosure pairs share a power bus 8, with four power shelves energizing each shared power bus 8. In the configuration shown in FIG. 11, two power shelves 12 are stacked adjacent to one another on each side of the blade enclosure 16. In this configuration, the upper two enclosure pairs share a power bus 8 and the lower two enclosure pairs share a power bus 8, with eight power shelves 12 energizing each shared power bus 8.

Figure 17:
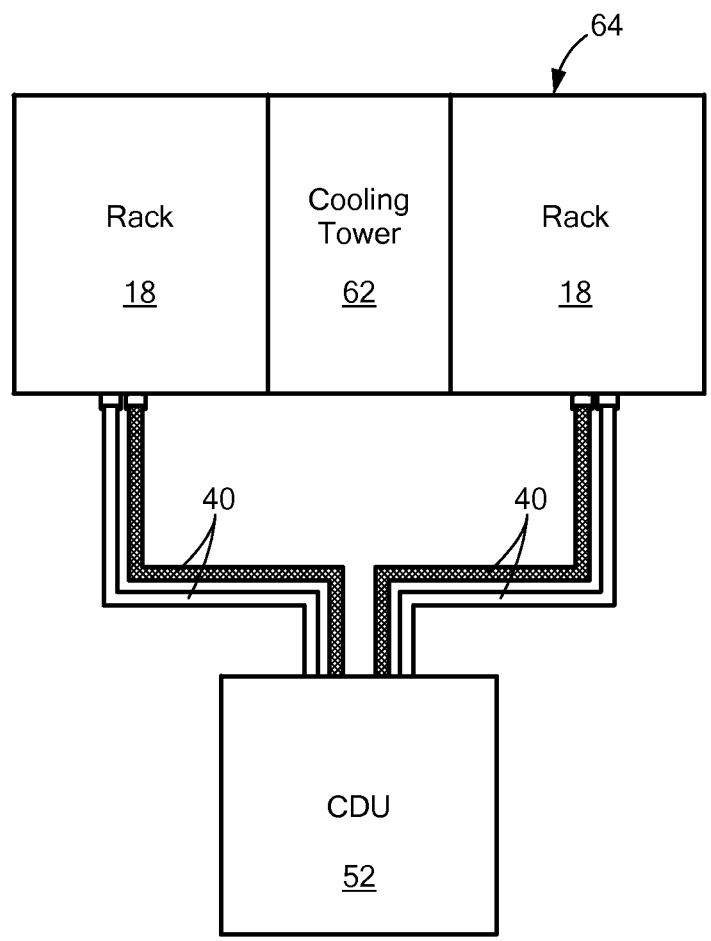
FIG. 17 schematically shows a closed-loop cooling cell configuration with an external cooling distribution unit (CDU) in accordance with an embodiment of the present invention.

In another embodiment, the compute rack 18 may include two blade enclosure pairs 16 disposed one on top of the other with one or more power shelves 12 disposed between the two enclosures 16 in a horizontal orientation, such as shown in FIGS. 8A and 9. FIG. 8B shows a connection interface 4 that may be used with the power shelf 12 and blade enclosure 16 arrangement shown in FIGS. 8A and 9. The two or more compute racks 18 may be arranged in a side-by-side configuration, as shown in FIG. 9, or with a cooling tower between them, as shown in FIG. 17, as discussed in more detail in the section entitled "Closed-loop Cooling Cell Configuration with CDU" below.

Figure 11:
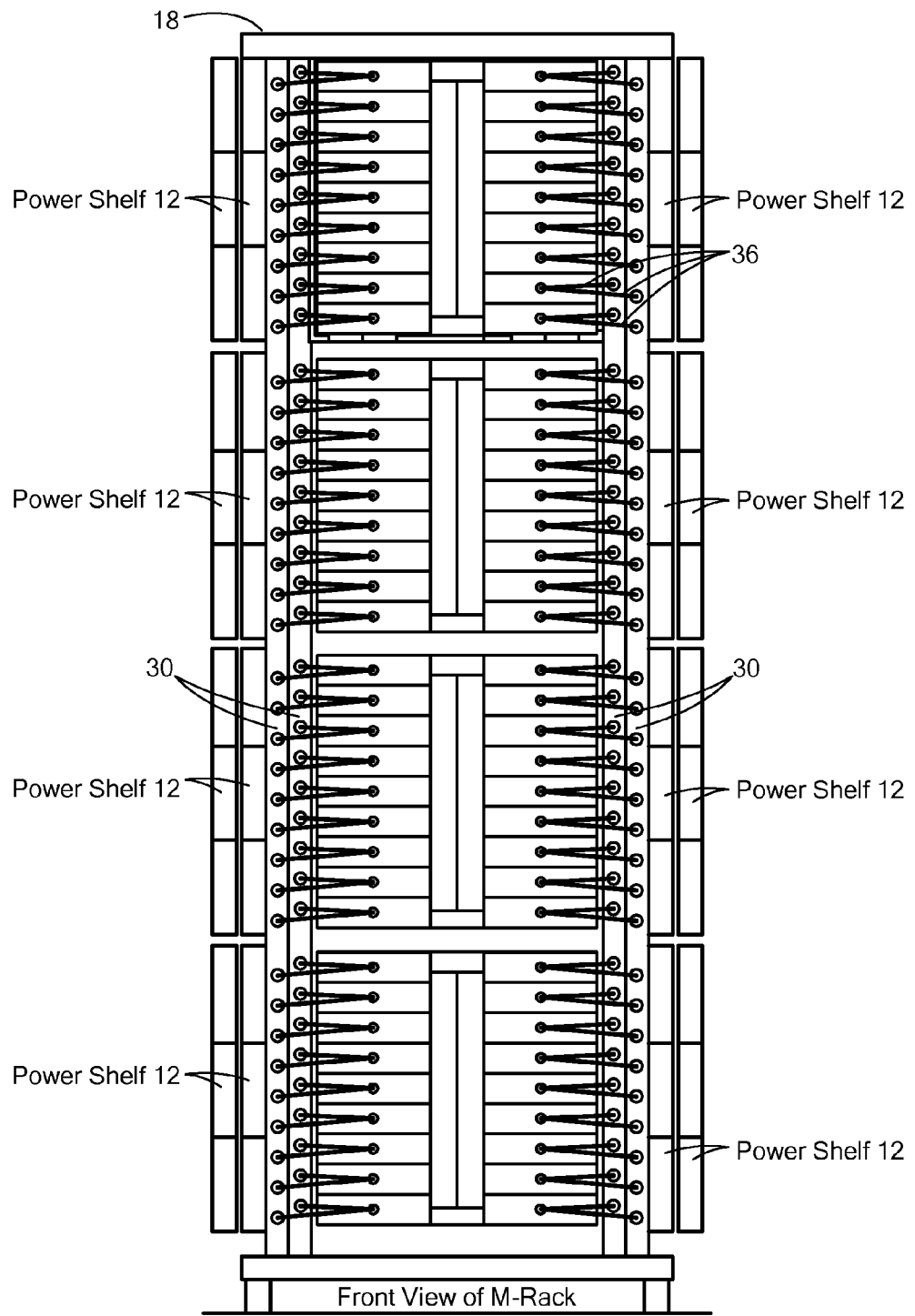
FIG. 11 schematically shows a front view of a compute rack configuration with a power distribution system having a double row of power shelves on a side of the blade enclosures in accordance with an embodiment of the present invention.
Figure 12A:
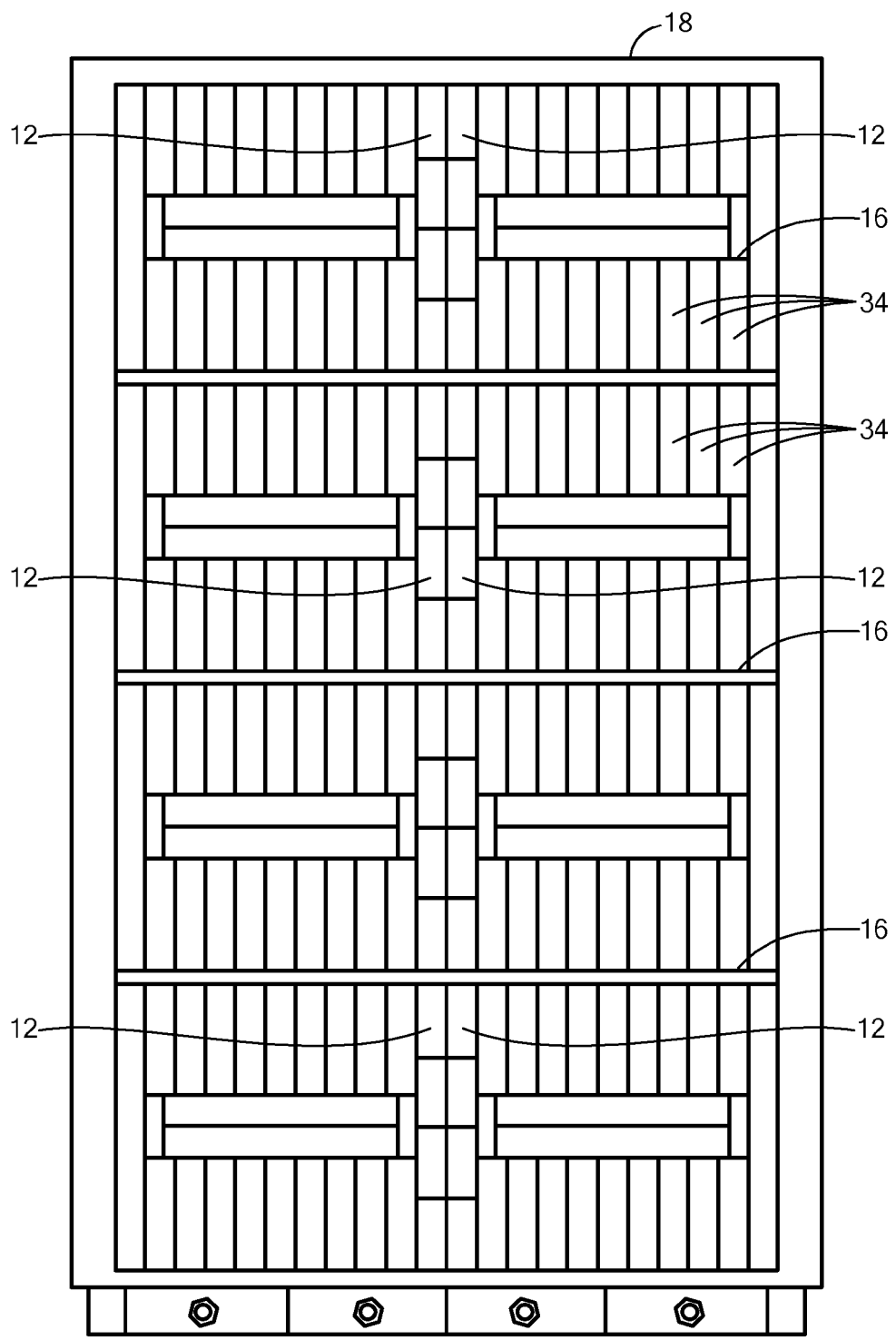
FIGS. 12A and 12B schematically show a front view and a back view, respectively, of a compute rack configuration with a power distribution system having power shelves between blade enclosures in accordance with an embodiment of the present invention.
Figure 12B:
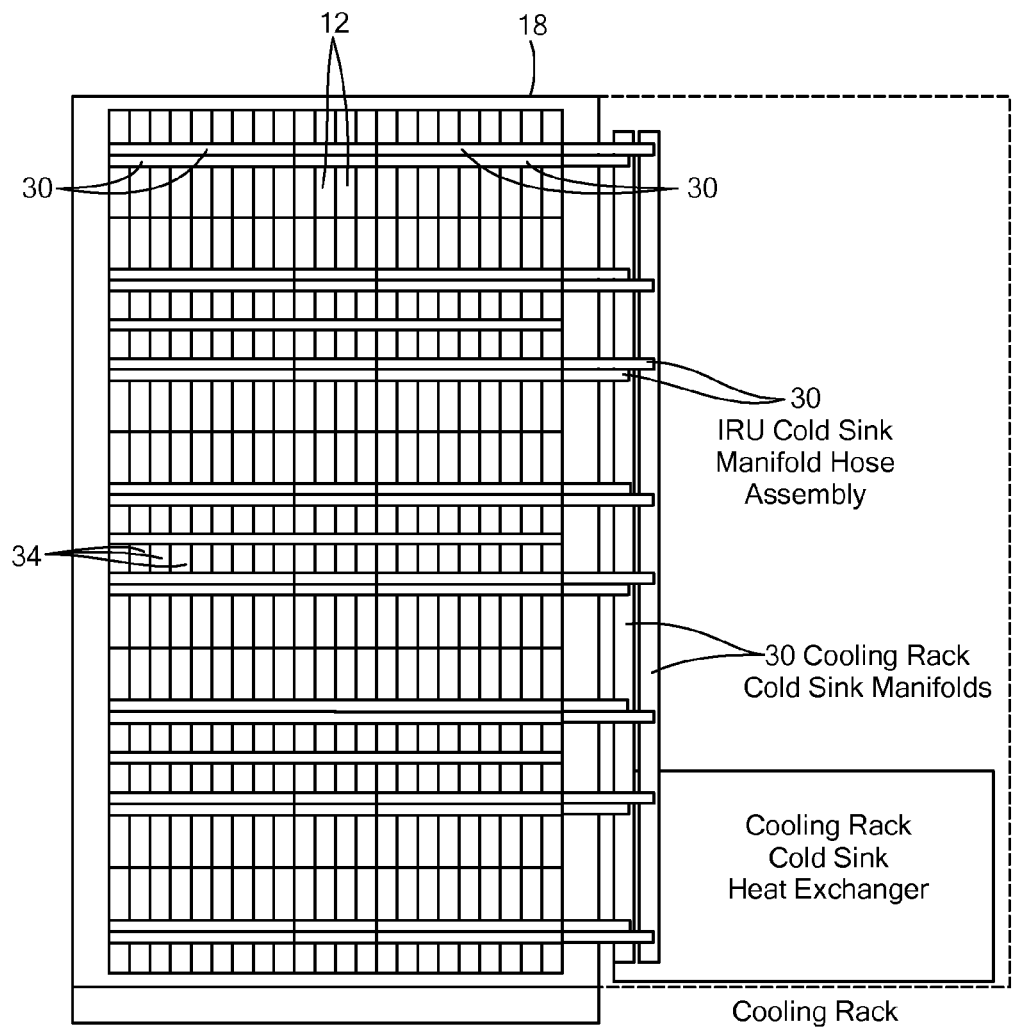

Rather than the power shelves 12 disposed on the outside of the compute rack 18, such as shown in FIGS. 4C, and 10A through 11, or disposed between the top and bottom of two blade enclosures 16, such as shown in FIGS. 8A and 9, the power shelves 12 may be disposed between two blade enclosures in a vertical orientation, such as shown in FIGS. 12A and 12B. In this case, the two blade enclosures 16 on the right and the left side of the power shelves 12 share the same power bus 8 and the connection interface 4 may be similar in shape to the one shown in FIG. 8B, but with the two rows of connectors 6 disposed in a vertical orientation rather than a horizontal orientation.

On-Blade Cooling System

The HPC system having the independently scalable power distribution system may further include an on-blade cooling system, such as shown in FIGS. 10A through 11. The on-blade cooling system includes one or more cooling plates 32 (shown in more detail in FIGS. 13B through 14B) and fluid connections 36 coupled to the cooling plates 32 and in fluid communication with a cooling manifold 30 in the blade enclosure 16. The cooling manifold 30 may include a dedicated supply line 30a and a return line 30b, which may be fluidly coupled to a respective supply line 40a and return line 40b of a fluid connection 40 that may provide cooling water. The cooling manifold 30 may be vertically disposed along a side of the blade enclosure 16, such as shown in FIGS. 10A and 10B, or may be horizontally and vertically disposed, such as shown in FIG. 12B.

Referring also to FIGS. 13A through 14B, the one or more cooling plates 32 are configured to be disposed between two computing boards 42 within the computing blade 34 and located between processor cores 38 on the upper and lower computing boards 42. Depending on the configuration, the on-blade cooling system may absorb approximately 50-60% of the heat dissipated by an individual dual-socket node in a computing blade 34. Preferably, each computing board 42 may be configured as a separate computing node, so that the computing blade 34 includes two computing nodes that are logically independent, but that are physically joined together and share various hardware components, in order to share a single slot in the blade enclosure 16. In this way, the loss of one computing board 42 does not render the entire computing blade 34 inoperable. This dual-node configuration effectively doubles the achievable compute density over the existing single node blade configurations. In addition, the computing blade 34 may include two side rails 44 configured to hold the computing board 42 within the computing blade 34. Further details of one embodiment of a computing blade and its dual-node configuration can be found in the application entitled TWIN SERVER BLADES FOR HIGH-DENSITY CLUSTERED COMPUTER SYSTEM, Ser. No. 13/931,748, filed on Jun. 28, 2013, which is incorporated by reference herein in its entirety.

Figure 14A:
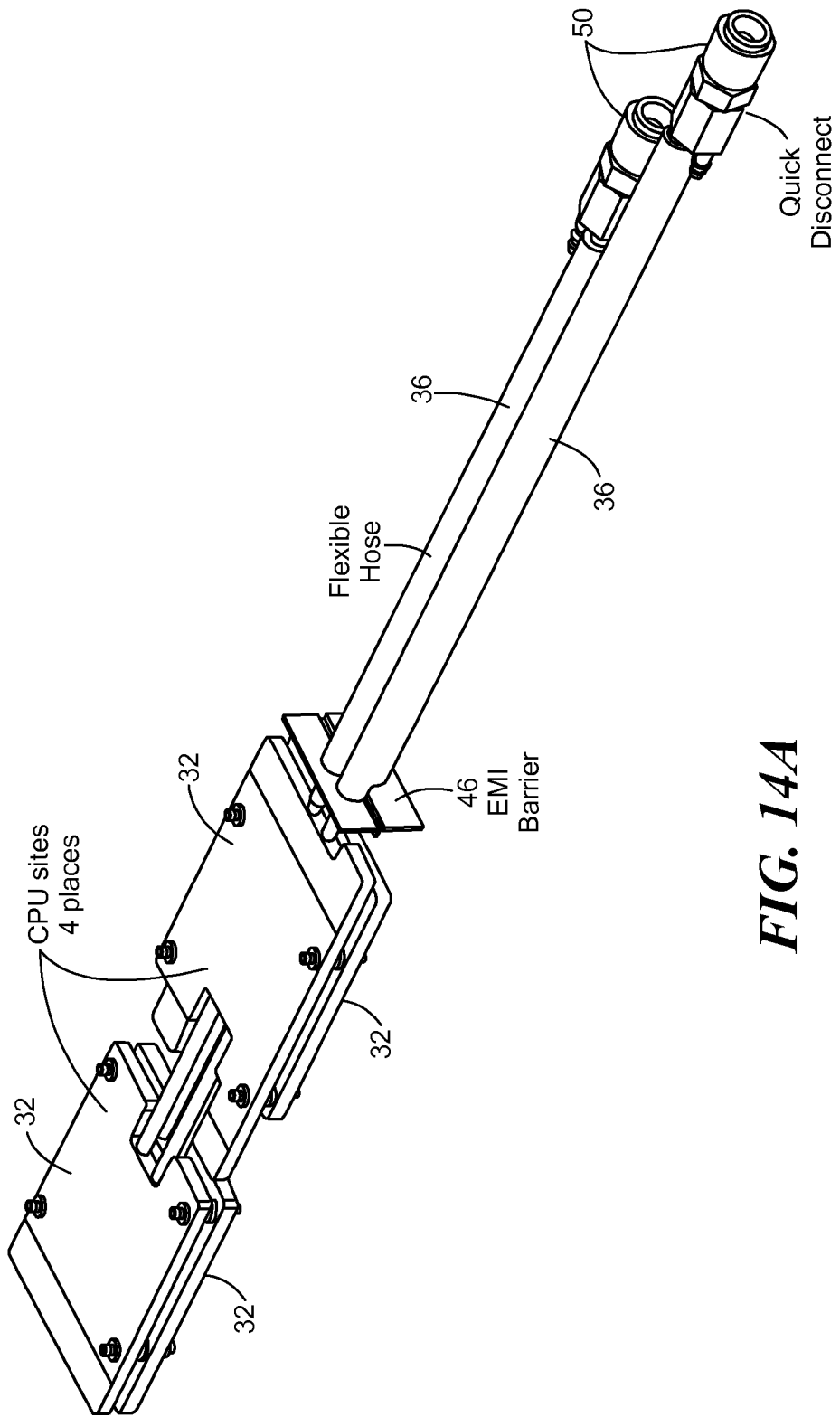
FIG. 14A schematically shows a top perspective view of a double cold sink plate configuration and FIG. 14B shows a top perspective view of a single cold sink plate configuration used with embodiments of the present invention.
Figure 14B:
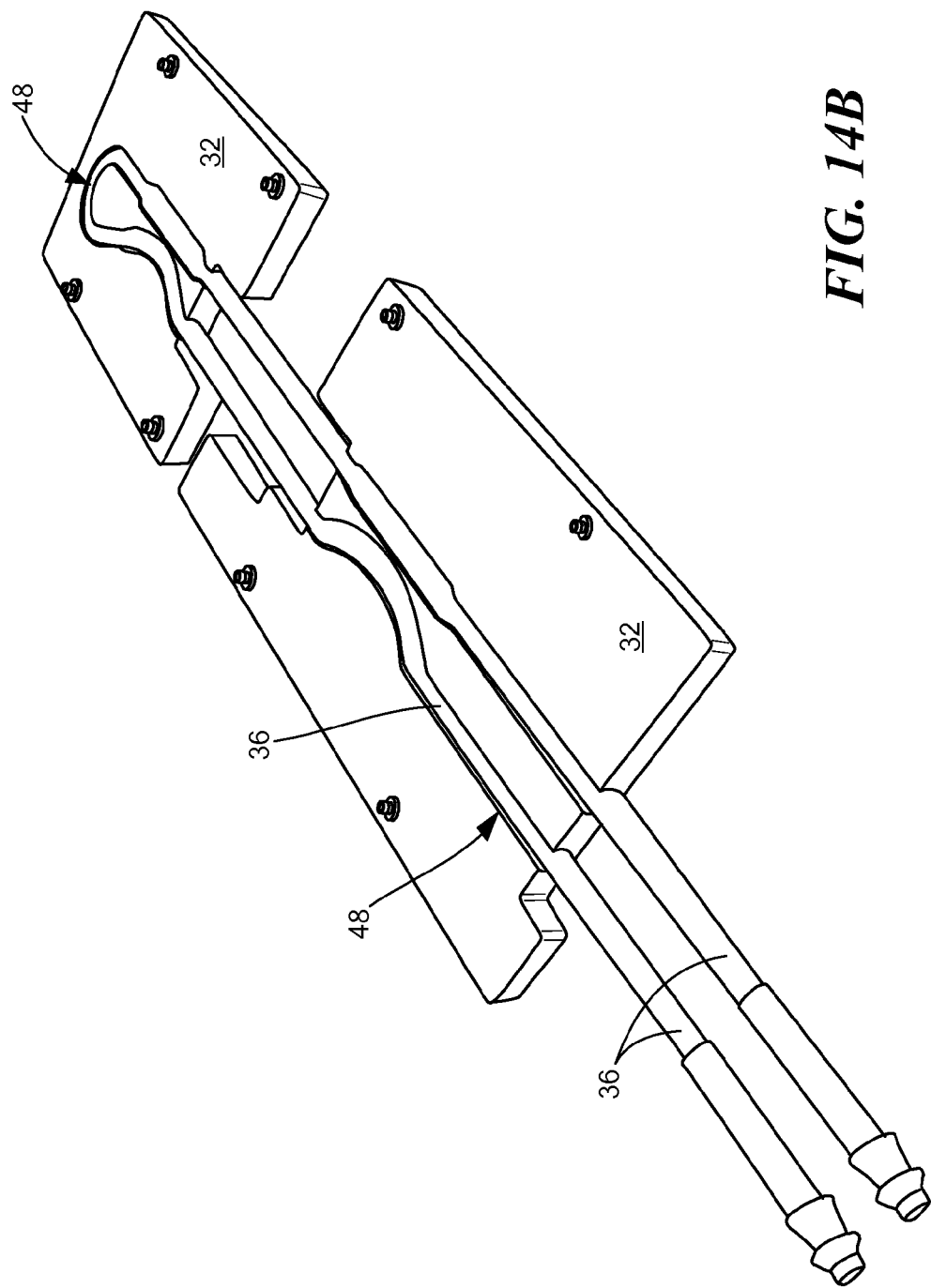

The one or more cooling plates 32 may be disposed on top of one another, such as shown in FIG. 14A, or the one or more cooling plates 32 may be in a side-by-side configuration, such as shown in FIG. 14B. Preferably, as shown in FIG. 13B, two cooling plates 32 are disposed between the two computing boards 42 in one region of the computing blade 34 and two cooling plates 32 are disposed between the two computing boards 42 in another region of the computing blade 34, so that each processor 38 in the computing board 42 has its own cooling plate 32. A bulkhead or front plate 46 of the computing blade 34 may be readily removed in order to allow access to the internal portions of the computing blade 34 and allow the installation and removal of the cooling plates 32 without blade disassembly. In addition, the front plate 46 may provide an electromagnetic interference (EMI) barrier between the internal computing blade components and the exterior environment.

As shown in more detail in FIG. 14B, the cooling plates 32 may have internal passages 48 that allow a cooling liquid (e.g., water) to flow through the passages 48 in order to remove the heat in the cooling plates 32. The heat is generated by the processors 38 in the computing blade 34 and absorbed by the cooling plates 32. The cooling plates 32 for each computing blade 34 are connected to the fluid cooling manifold 30 via fluid connectors 50. The fluid connectors 50 are attached to the end of the fluid connections 36, e.g., the end of a flexible hose. This configuration allows the cooling fluid from the cooling manifold 30 to flow through each of the fluid connections 36 for each of the computing blades 34 (and thus through each set of cooling plates 32 within the given computing blades 34) substantially in parallel with one another. Further details of the on-blade cooling system and cooling plate 32 configuration can be found in the application entitled ON-BLADE COLD SINK FOR HIGH-DENSITY CLUSTERED COMPUTER SYSTEM, Ser. No. 13/931,730, filed on Jun. 28, 2013, which is incorporated by reference herein in its entirety.

Referring again to FIGS. 10A and 10B, in operation, cooling liquid flows through fluid connections 40 to the supply line 30a in the cooling manifolds 30 in the blade enclosures 16 and then through the supply line 36a of the fluid connections 36 that connects each individual blade 34 to the cooling manifolds 30. The cooling liquid then flows through the return line 36b to a return line 30b in the cooling manifold 30 and the warmed cooling liquid is returned via the fluid connections 40. The fluid connections 40 may be connected to a broad range of facilities supplied cooling water via supply lines 40a and return lines 40b, with or without an additional external chiller unit connected to the fluid connections 40. In situations where additional cooling is needed, a liquid-to-water heat exchanger may be connected to the fluid connections 40, as discussed further in the section entitled "Cooling Distribution Unit with On-Blade Cooling" below.

The cooling plates 32 may replace the heat sinks typically used with processors within computing blades 34. For example, a single set of cooling plates 32 may be disposed between opposing boards 42 or two sets of cooling plates 32 may be disposed between opposing boards 42. Alternatively, the cooling plates 32 may be used in conjunction with air-cooled heat sinks. For example, heat sinks may be placed on either side of a computing board 42 and then the cooling plate 32 may be placed adjacent to one or more of the heat sinks. Any additional heat may be air cooled by fans located at the back of the rack or air-cooled by a closed-loop air flow configuration as discussed in more detail in the section entitled "Closed-loop Cooling Cell Configuration with CDU" below.

Cooling Distribution Unit with On-Blade Cooling

Figure 15:
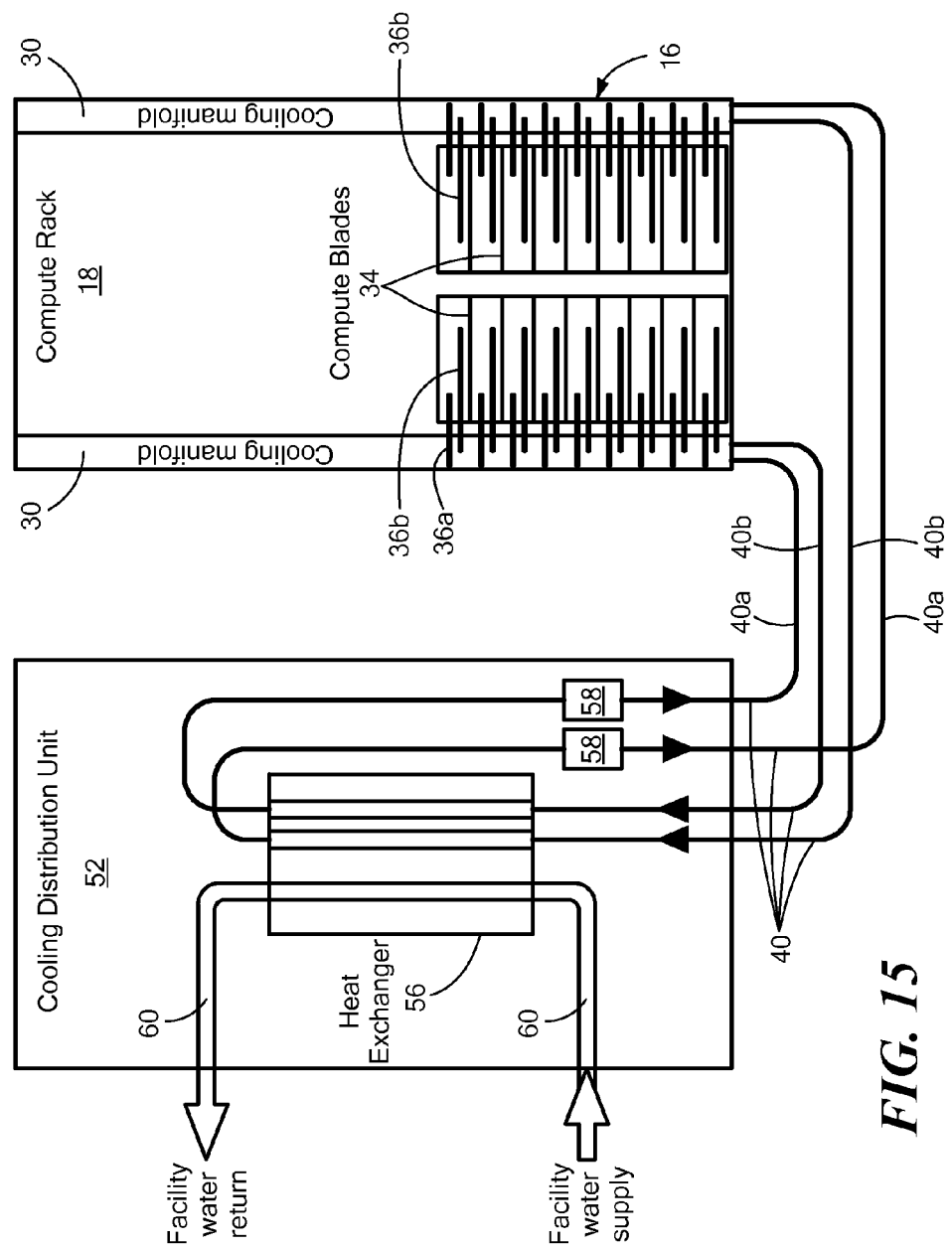
FIG. 15 schematically shows the water flow between one compute rack and an external cooling distribution unit (CDU) in accordance with an embodiment of the present invention.

As shown in FIG. 15, the HPC system having the independently scalable power distribution system and the on-blade cold sink system may be used with an external cooling system, such as a cooling distribution unit (CDU) 52 that is external to the compute rack 18 that holds the blade enclosure(s) 16, in order to support an increased cooling requirement for certain types of computing blades, e.g., the 720 W Gemini Twin computing blade sold by Silicon Graphics International Corp. of Fremont, Calif. For example, when the amount of heat generated by the computing blade 34 exceeds about 600 watts, a CDU 52 may be used in conjunction with the on-blade cooling system described above. The CDU 52 may be connected to the one or more blade enclosures 16 via a set of fluid connections 40, e.g., hoses, one having a supply line 40a and one having a return line 40b.

Figure 16:
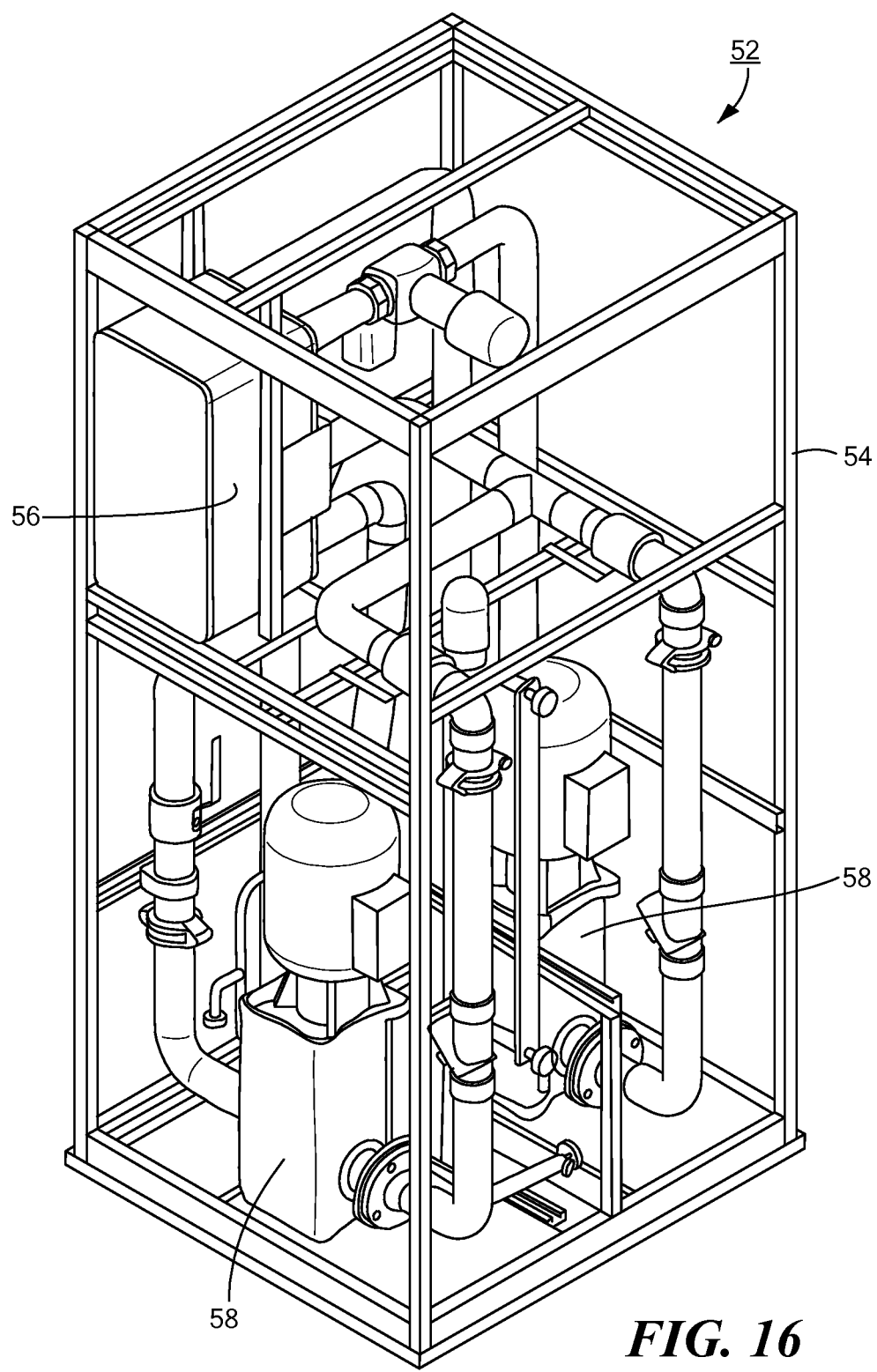
FIG. 16 schematically shows an external cooling distribution unit (CDU), with portions of the housing removed, for use with embodiments of the present invention.

Referring also to FIG. 16, the CDU 52 includes a housing 54 that encloses a heat exchanger 56 and one or more circulating pump(s) 58 along with other controls, valves and piping. FIG. 15 shows the coolant path from the CDU 52 to the cooling manifolds 30 located in the blade enclosures 16. In operation, the one or more circulating pumps 58 are configured to move cooling liquid within the supply line 40a of the fluid connections 40 to the cooling manifolds 30 and then through the fluid connections 36 that connect each individual blade 34 to the cooling manifolds 30. After the cooling liquid flows through the passages 48 in the cooling plate 32 and removes the heat generated by the processors 38 in the blade 34, then the cooling liquid flows to a return line in the cooling manifold 30 and the warmed cooling liquid is returned to the CDU 52 via the return line 40b of the fluid connections 40. The CDU 52 removes the heat from the cooling liquid via the heat exchanger 56, which is cooled with facility supplied cooling water via fluid connections 60, and then the CDU 52 pumps the cooled cooling liquid back to the cooling manifolds 30.

The coolant path from the CDU 52 to the cooling manifolds 30 is a closed-loop system, which helps minimize the amount of liquid lost if a leak occurs in the fluid connections 36 or 40. For example, the closed-loop system may hold approximately 55 gallons of distilled water with a water treatment solution, e.g., approximately one liter. Suitable water treatment solutions that may be used include sodium hydroxide solutions, such as those commercial available from Chemtreat, Inc. of Richmond, Va.

The CDU 52 is an interface between the building chilled water system and the cooling manifolds 30 within the compute rack 18 and is designed to circulate and control the chilled water to the cooling manifolds 30. To this end, the CDU 52 may monitor room conditions and prevent coil condensation by maintaining the chilled water being pumped to the cooling manifolds 30 at a temperature above the room's dew point. All functions within the CDU 52 may be automated, such as switching pumps (if applicable), controlling water temperature, etc. The CDU 52 is connected by fluid connections 60 to the building supply and return piping, and also connected to the cooling manifolds 30 by fluid connections 40.

Closed-Loop Cooling Cell Configuration with CDU

The HPC system having the independently scalable power distribution system and the on-blade cold sink system may also be used with a closed-loop cooling cell configuration that includes two compute racks 18 and a cooling tower 62 between the compute racks 18, as shown in FIG. 17. Each compute rack 18 includes at least one blade enclosure 16 having one or more power shelves 12 and the cooling manifolds 30, and the on-blade cooling system as discussed above. For example, the cooling tower 62 may be used with the rack configurations shown in FIGS. 10A through 12B that include the cooling manifolds 30.

The cooling tower 62 includes one or more water-cooled heat exchangers and one or more blowers configured to draw warm air from the side of the compute racks towards the back, across the water-cooled heat exchanger, and to circulate cooled air to the side of the compute racks towards the front. The closed-loop cooling cell configuration further includes a housing 64 enclosing the compute racks 18 and the cooling tower 62 to provide a closed-loop air flow within the housing 64. Further details of the closed-loop cooling cell configuration can be found in the application entitled CLOSED-LOOP COOLING SYSTEM FOR HIGH-DENSITY CLUSTERED COMPUTER SYSTEM, Ser. No. 13/931,754, filed on Jun. 28, 2013, which is incorporated by reference herein in its entirety.

Although the above discussion discloses various exemplary embodiments of the invention, it should be apparent that those skilled in the art can make various modifications that will achieve some of the advantages of the invention without departing from the true scope of the invention.

What is claimed is:

1. A high performance computing (HPC) system comprising:
   one or more blade enclosures configured to hold a plurality of computing blades;
   a connection interface having one or more connectors and a shared power bus that distributes power to the one or more blade enclosures, the connection interface coupled to the one or more blade enclosures; and
   at least one power shelf configured to hold one or more power supplies, the at least one power shelf removably coupled to the one or more connectors in the connection interface.

2. The HPC system of claim 1, wherein the at least one power shelf is removably coupled to the one or more connectors in a vertical orientation at a side of the blade enclosure.

3. The HPC system of claim 2, wherein the system includes at least two power shelves, a first power shelf is adjacent to a second power shelf at the side of one blade enclosure.

4. The HPC system of claim 2, wherein the at least one power shelf is disposed between two blade enclosures.

5. The HPC system of claim 2, wherein the system includes at least two power shelves and two blade enclosures, the two blade enclosures are coupled to each other on one side, and one power shelf is adjacent to each blade enclosure on another side.

6. The HPC system of claim 1, wherein the system includes at least two blade enclosures and the at least one power shelf is disposed between a bottom of a first blade enclosure and a top of a second blade enclosure in a horizontal orientation.

7. The HPC system of claim 1, wherein the power shelf is configured to hold three power supplies or four power supplies.

8. The HPC system of claim 1, further comprising the plurality of computing blades in each blade enclosure.

9. The HPC system of claim 1, wherein the power shelf includes a power distribution board having a control connection, a DC power connection and an AC power connection, the control and power connections configured to removably couple to the one or more connectors, the power distribution board configured to connect the power supplies together on the shared power bus that distributes power to the blade enclosures.

10. A high performance computing (HPC) system comprising:
   one or more blade enclosures configured to hold a plurality of computing blades;
   the plurality of computing blades in each blade enclosure;
   a connection interface having one or more connectors and a shared power bus that distributes power to the one or more blade enclosures, the connection interface coupled to the one or more blade enclosures;
   at least one power shelf removably coupled to the one or more connectors and configured to hold one or more power supplies, each power shelf having a power distribution board configured to connect the power supplies together on the shared power bus; and
   the one or more power supplies connected to the power distribution board.

11. The HPC system of claim 10, wherein the power distribution board has a control connection, a DC power connection and an AC power connection, and the control and power connections are configured to removably couple to the one or more connectors.

12. The HPC system of claim 10, wherein the blade enclosure includes a fluid cooling manifold and at least one of the computing blades includes two computing boards, the system further comprising:
   one or more cooling plates, each cooling plate disposed between the two computing boards; and
   a fluid connection coupled to the cooling plate and in fluid communication with the fluid cooling manifold.

13. The HPC system of claim 12, wherein the cooling manifold is along a side or a back of the blade enclosure and configured to connect to each cooling plate between the two computing boards.

14. The HPC system of claim 12, wherein two cooling plates are disposed between the two computing boards in a side-by-side configuration, one cooling plate between the two computing boards in one region of the computing blade and the other cooling plate between the two computing boards in another region of the computing blade.

15. The HPC system of claim 12, wherein four cooling plates are disposed between the two computing boards, two cooling plates between the two computing boards in one region of the computing blade and the other two cooling plates between the two computing boards in another region of the computing blade.

16. The HPC system of claim 12, further comprising an external cooling distribution unit having fluid connections in fluid communication with the cooling manifold.

17. The HPC system of claim 16, wherein the external cooling distribution unit further includes
   a liquid-cooled heat exchanger in contact with a portion of the fluid connections; and
   one or more pumps configured to move liquid within the fluid connections from the cooling manifolds to the liquid-cooled heat exchanger.

18. The HPC system of claim 12, wherein the blade enclosures are configured in two compute racks, and the system further includes:
   a cooling tower adjacent to a side of the first compute rack and a side of the second compute rack, the cooling tower having at least one water-cooled heat exchanger, and one or more blowers configured to draw warm air from the side towards a back of the first and second compute racks across the water-cooled heat exchanger, and to circulate cooled air to the side towards a front of the first and second compute racks; and
   a housing enclosing the first compute rack, the second compute rack, and the cooling tower to provide a closed-loop air flow within the housing.

19. The HPC system of claim 10, wherein the at least one power shelf is removably coupled to the one or more connectors in a vertical orientation.

20. The HPC system of claim 10, wherein the at least one power shelf is removably coupled to the one or more connectors in a horizontal orientation.

* * * * *